(12) United States Patent
Li

(10) Patent No.: US 12,224,018 B2
(45) Date of Patent: Feb. 11, 2025

(54) SEMICONDUCTOR STORAGE DEVICE AND VOLTAGE CONTROL METHOD FOR SEMICONDUCTOR STORAGE DEVICE

(71) Applicant: Kioxia Corporation, Tokyo (JP)

(72) Inventor: Xu Li, Yokohama (JP)

(73) Assignee: Kioxia Corporation, Tokyo (JP)

( * ) Notice: Subject to any disclaimer, the term of this patent is extended or adjusted under 35 U.S.C. 154(b) by 225 days.

(21) Appl. No.: 17/654,292

(22) Filed: Mar. 10, 2022

(65) Prior Publication Data

US 2023/0093270 A1 Mar. 23, 2023

(30) Foreign Application Priority Data

Sep. 21, 2021 (JP) ................. 2021-153543

(51) Int. Cl.
  *G11C 16/30* (2006.01)
  *G11C 5/14* (2006.01)
  *G11C 8/12* (2006.01)
  *G11C 16/04* (2006.01)
  *G11C 16/08* (2006.01)
  *G11C 16/10* (2006.01)
  (Continued)

(52) U.S. Cl.
  CPC .............. *G11C 16/30* (2013.01); *G11C 5/147* (2013.01); *G11C 8/12* (2013.01); *G11C 16/0483* (2013.01); *G11C 16/08* (2013.01); *G11C 16/10* (2013.01); *G11C 16/26* (2013.01); *G11C 16/3459* (2013.01); *G11C 8/08* (2013.01); *G11C 16/32* (2013.01)

(58) Field of Classification Search
  CPC ..... G11C 16/30; G11C 16/0483; G11C 16/08; G11C 8/08; G11C 16/26; G11C 16/3459; G11C 16/32; G11C 5/147; G11C 8/12; G11C 16/10
  See application file for complete search history.

(56) References Cited

U.S. PATENT DOCUMENTS 7,936,004 B2  5/2011  Kito et al.
8,334,551 B2  12/2012  Itagaki et al.
        (Continued)

FOREIGN PATENT DOCUMENTS

EP      0 986 167 A3   3/2000
JP       3143434 B2    3/2001
        (Continued)

*Primary Examiner* — Hoai V Ho
*Assistant Examiner* — Justin Bryce Heisterkamp
(74) *Attorney, Agent, or Firm* — Oblon, McClelland, Maier & Neustadt, L.L.P.

(57) ABSTRACT

A semiconductor storage device of an embodiment includes a plurality of blocks, a voltage supply circuit configured to generate read voltage Vr to be supplied to signal lines, a block decoder capable of setting, for each of the selected blocks, whether the read voltage Vr is applied to word lines, and a sequencer configured to perform operation that reads data. The voltage supply circuit generates power voltage VRD and power voltage VBB that is negative voltage and supplies these voltages to the block decoder. During the reading operation, a value of the power voltage VRD is changed between voltage Vhr and voltage Vlr and a value of the power voltage VBB is changed between voltage Vhb and voltage Vlb. The voltage Vhr is larger than zero volt, and the voltage Vlb is lower than zero volt.

19 Claims, 20 Drawing Sheets

(51) Int. Cl.
  *G11C 16/26* (2006.01)
  *G11C 16/34* (2006.01)
  *G11C 8/08* (2006.01)
  *G11C 16/32* (2006.01)

(56) References Cited

U.S. PATENT DOCUMENTS

| | | | |
|---|---|---|---|
| 8,551,838 B2 | 10/2013 | Kito et al. | |
| 8,559,227 B2* | 10/2013 | Kwon | G11C 16/32 |
| | | | 365/185.27 |
| 8,599,614 B2 | 12/2013 | Miida et al. | |
| 9,064,735 B2 | 6/2015 | Kito et al. | |
| 9,214,242 B2 | 12/2015 | Miida et al. | |
| 9,748,260 B2 | 8/2017 | Kito et al. | |
| 9,818,483 B2 | 11/2017 | Hahn et al. | |
| 10,211,219 B2 | 2/2019 | Kito et al. | |
| 10,297,338 B2 | 5/2019 | Shirakawa et al. | |
| 10,916,559 B2 | 2/2021 | Kito et al. | |
| 11,107,542 B2 | 8/2021 | Sako | |
| 11,189,392 B2 | 11/2021 | Matsuyama et al. | |
| 2007/0147141 A1* | 6/2007 | Shibata | G11C 16/3459 |
| | | | 365/189.09 |
| 2008/0259690 A1* | 10/2008 | Chae | G11C 16/0483 |
| | | | 365/185.18 |
| 2010/0008165 A1* | 1/2010 | Macerola | G11C 16/0483 |
| | | | 365/189.15 |
| 2011/0096602 A1* | 4/2011 | Kim | G11C 16/34 |
| | | | 365/185.11 |
| 2014/0247658 A1* | 9/2014 | Hosono | G11C 16/08 |
| | | | 365/185.11 |
| 2020/0033488 A1 | 1/2020 | Yamane | |
| 2021/0126011 A1 | 4/2021 | Kito et al. | |
| 2021/0126012 A1 | 4/2021 | Kito et al. | |
| 2021/0280252 A1* | 9/2021 | Kobayashi | G11C 5/147 |
| 2023/0064982 A1* | 3/2023 | Shiga | G11C 13/0038 |

FOREIGN PATENT DOCUMENTS

| | | |
|---|---|---|
| JP | 5016832 B2 | 9/2012 |
| JP | 5086959 B2 | 11/2012 |
| JP | 6478433 B2 | 3/2019 |
| JP | 2020-16543 A | 1/2020 |
| JP | 2020-102287 A | 7/2020 |
| JP | 2021-141459 A | 9/2021 |

* cited by examiner

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 9

| VERIFY TARGET STATE \ THE NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| STATE "A"(VfyA) | ○ | ○ | ○ | ○ | ○ | ○ | | | | | | | | | | | | | |
| STATE "B"(VfyB) | | ○ | ○ | ○ | ○ | ○ | ○ | ○ | | | | | | | | | | | |
| STATE "C"(VfyC) | | | | | ○ | ○ | ○ | ○ | ○ | ○ | | | | | | | | | |
| STATE "D"(VfyD) | | | | | | | ○ | ○ | ○ | ○ | ○ | ○ | | | | | | | |
| STATE "E"(VfyE) | | | | | | | | | ○ | ○ | ○ | ○ | ○ | ○ | | | | | |
| STATE "F"(VfyF) | | | | | | | | | | | | ○ | ○ | ○ | ○ | ○ | | | |
| STATE "G"(VfyG) | | | | | | | | | | | | | | ○ | ○ | ○ | ○ | ○ | ○ | ial
SEMICONDUCTOR STORAGE DEVICE AND VOLTAGE CONTROL METHOD FOR SEMICONDUCTOR STORAGE DEVICE

CROSS-REFERENCE TO RELATED APPLICATIONS

This application is based upon and claims the benefit of priority from the prior Japanese Patent Application No. 2021-153543 filed on Sep. 21, 2021; the entire contents of which are incorporated herein by reference.

FIELD

Embodiments described herein relate generally to a semiconductor storage device and a voltage control method for the semiconductor storage device.

BACKGROUND

A NAND flash memory is known as a semiconductor storage device.

BRIEF DESCRIPTION OF THE DRAWINGS

FIG. 9 is a diagram illustrating a relation between the number of loops and program and verify operations in write operation based on a standard writing sequence;

DETAILED DESCRIPTION

A semiconductor storage device of the present embodiment includes: a first block including a first memory cell; a second block including a second memory cell; a first local word line connected to a gate of the first memory cell; a second local word line connected to a gate of the second memory cell; a bit line electrically connected to one end of the first memory cell; and a global word line. The semiconductor storage device also includes: a voltage generation circuit configured to generate and supply a read voltage to the global word line; a first transfer transistor connected between the global word line and the first local word line; a second transfer transistor connected between the global word line and the second local word line; a first block decoder configured to supply either one of a first selection signal or a first non-selection signal to a gate of the first transfer transistor in response to a block address input thereto; a second block decoder configured to supply either one of a second selection signal or a second non-selection signal to a gate of the second transfer transistor in response to the block address input thereto; and a control unit configured to perform a read operation to either one of the first memory cell or the second memory cell in response to a read command accompanied with the block address. The voltage generation circuit is further configured to generate and supply a first power voltage and a second power voltage to each of the first block decoder ant the second block decoder. During the read operation, a value of the first power voltage is changed between a first set value and a second set value lower than the first set value, and a value of the second power voltage is changed between a third set value lower than the first set value and a fourth set value lower than both of the second set value and the third set value, the first set value being larger than zero volt, the fourth set value being lower than zero volt.

An embodiment will be described below with reference to the accompanying drawings.

First Embodiment (1. Configuration)
(1-1. Configuration of Memory System)

Figure 1:
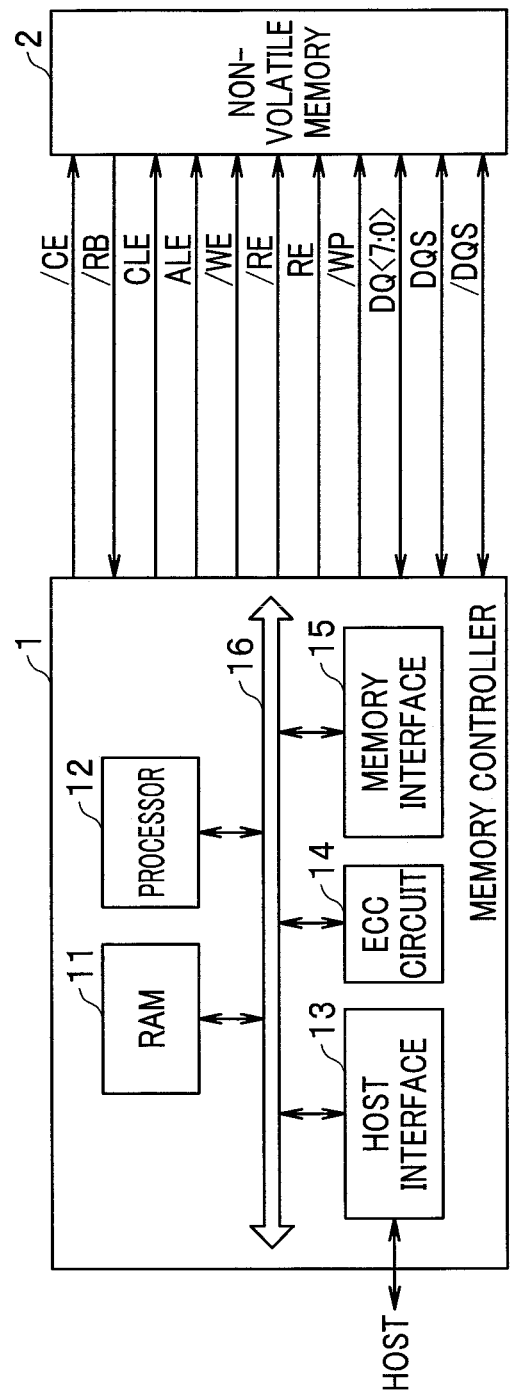
FIG. 1 is a block diagram illustrating an exemplary configuration of a storage device according to an embodiment.

FIG. 1 is a block diagram illustrating an exemplary configuration of a memory system according to an embodiment. The memory system of the embodiment includes a memory controller 1 and a non-volatile memory 2 as a semiconductor storage device. The memory system is connectable to a host. The host is an electronic device such as a personal computer or a portable terminal.

The non-volatile memory 2 is a memory configured to store data in a non-volatile manner and includes, for example, a NAND memory (NAND flash memory). The non-volatile memory 2 is, for example, a NAND memory including a memory cell capable of storing three bits, that is, a 3 bit/Cell (triple level cell (TLC)) NAND memory. The non-volatile memory 2 may be a 1 bit/Cell NAND memory or a NAND memory capable of performing storage in a plurality of bits, such as a 2 bit/Cell, 4 bit/Cell or greater NAND memory. Typically, the non-volatile memory 2 is constituted by a plurality of memory chips.

The memory controller 1 controls data writing to the non-volatile memory 2 in accordance with a writing request from the host. The memory controller 1 also controls data reading from the non-volatile memory 2 in accordance with a read request from the host. A chip enable signal/CE, a ready/busy signal/RB, a command latch enable signal CLE, an address latch enable signal ALE, a write enable signal/WE, read enable signals RE and/RE, a write protect signal/WP, signals DQ <7:0> as data, and data strobe signals DQS and/DQS are transmitted and received between the memory controller 1 and the non-volatile memory 2. Note that a symbol "/" added to a signal name indicates active low.

For example, the non-volatile memory 2 and the memory controller 1 are each formed as a semiconductor chip (hereinafter also simply referred to as "chip").

The chip enable signal/CE is a signal for selecting and enabling a particular memory chip of the non-volatile memory 2. The ready/busy signal/RB is a signal for indicating whether the non-volatile memory 2 is in a ready state (state in which a command from outside can be received) or a busy state (state in which a command from outside cannot be received). The memory controller 1 can know a state of the non-volatile memory 2 by receiving a signal RB. The command latch enable signal CLE is a signal indicating that the signals DQ <7:0> are commands. The command latch enable signal CLE enables latch of a command transmitted as a signal DQ at a command register in a selected memory chip in the non-volatile memory 2. The address latch enable signal ALE is a signal indicating that the signals DQ <7:0> are addresses. The address latch enable signal ALE enables latch of an address transmitted as a signal DQ at an address register in a selected memory chip in the non-volatile memory 2. The write enable signal/WE is a signal for taking a received signal into the non-volatile memory 2 and is asserted each time a command, an address, or data is received by the memory controller 1. The non-volatile memory 2 is instructed to take in the signals DQ <7:0> when the signal/WE is at "Low (L)" level.

The read enable signals RE and/RE are signals for the memory controller 1 to read data from the non-volatile memory 2. For example, the read enable signals RE and/RE are used to control an operation timing of the non-volatile memory 2 when the signals DQ <7:0> are output. The write protect signal/WP is a signal for instructing the non-volatile memory 2 to inhibit data writing and erasure. The signals DQ <7:0> are main bodies of data transmitted and received between the non-volatile memory 2 and the memory controller 1 and include commands, addresses, and data. The data strobe signals DQS and/DQS are signals for controlling input-output timings of the signals DQ <7:0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to one another through an internal bus 16.

The host interface 13 outputs, to the internal bus 16, for example, a request and user data (write data) received from the host. In addition, the host interface 13 transmits, to the host, for example, user data read from the non-volatile memory 2 and a response from the processor 12.

The memory interface 15 controls, based on an instruction from the processor 12, processing of writing user data or the like to the non-volatile memory 2 and processing of reading user data or the like from the non-volatile memory 2.

The processor 12 collectively controls the memory controller 1. The processor 12 is, for example, a central processing unit (CPU) or a micro processing unit (MPU). When having received a request from the host through the host interface 13, the processor 12 performs control in accordance with the request. For example, in accordance with a request from the host, the processor 12 instructs the memory interface 15 to write user data and parity to the non-volatile memory 2. In addition, in accordance with a request from the host, the processor 12 instructs the memory interface 15 to read user data and parity from the non-volatile memory 2.

The processor 12 determines, for user data accumulated in the RAM 11, a storage region (memory region) in the non-volatile memory 2. The user data is stored in the RAM 11 through the internal bus 16. The processor 12 performs the memory region determination for data (page data) per page as a unit of writing. In the present specification, unit data is defined to be user data stored in a page of the non-volatile memory 2. The unit data is typically encoded by the ECC circuit 14 and stored in the non-volatile memory 2 as a code word. In the present embodiment, encoding is not essential. The memory controller 1 may store the unit data in the non-volatile memory 2 without encoding, but FIG. 1 illustrates an exemplary configuration in which encoding is performed. When the memory controller 1 does not perform encoding, the page data is same as the unit data. One code word may be generated based on one unit data or based on division data into which the unit data is divided. Alternatively, one code word may be generated by using a plurality of pieces of unit data.

The processor 12 determines, for each unit data, a memory region in the non-volatile memory 2 at a writing destination. A physical address is allocated to each memory region in the non-volatile memory 2. The processor 12 manages a memory region at the writing destination of each unit data by using the physical address. The processor 12 designates the determined memory region (physical address) and instructs the memory interface 15 to write user data to the non-volatile memory 2. The processor 12 manages correspondence between a logical address (logical address managed by the host) and a physical address of user data. When having received a read request including a logical address from the host, the processor 12 specifies a physical address corresponding to the logical address and instructs, with designation of the physical address, the memory interface 15 to read user data.

The ECC circuit 14 generates a code word by encoding user data stored in the RAM 11. In addition, the ECC circuit 14 decodes a code word read from the non-volatile memory 2.

The RAM 11 temporarily stores user data received from the host until the user data is stored in the non-volatile memory 2, and temporarily stores data read from the non-volatile memory 2 until the data is transmitted to the host. The RAM 11 is a general-purpose memory such as a static random access memory (SRAM) or a dynamic random access memory (DRAM).

In the exemplary configuration illustrated in FIG. 1, the memory controller 1 includes the ECC circuit 14 and the memory interface 15. However, the ECC circuit 14 may be built in the memory interface 15. Alternatively, the ECC circuit 14 may be built in the non-volatile memory 2.

When having received a writing request from the host, the memory system operates as follows. The processor 12 temporarily stores data as a writing target in the RAM 11. The processor 12 reads data stored in the RAM 11 and inputs the data to the ECC circuit 14. The ECC circuit 14 encodes the input data and inputs a resulting code word to the memory interface 15. The memory interface 15 writes the input code word to the non-volatile memory 2.

When having received a read request from the host, the memory system operates as follows. The memory interface 15 inputs a code word read from the non-volatile memory 2 to the ECC circuit 14. The ECC circuit 14 decodes the input code word and stores resulting decoded data in the RAM 11. The processor 12 transmits the data stored in the RAM 11 to the host through the host interface 13.

(1-2. Configuration of Non-Volatile Memory)

Figure 2:
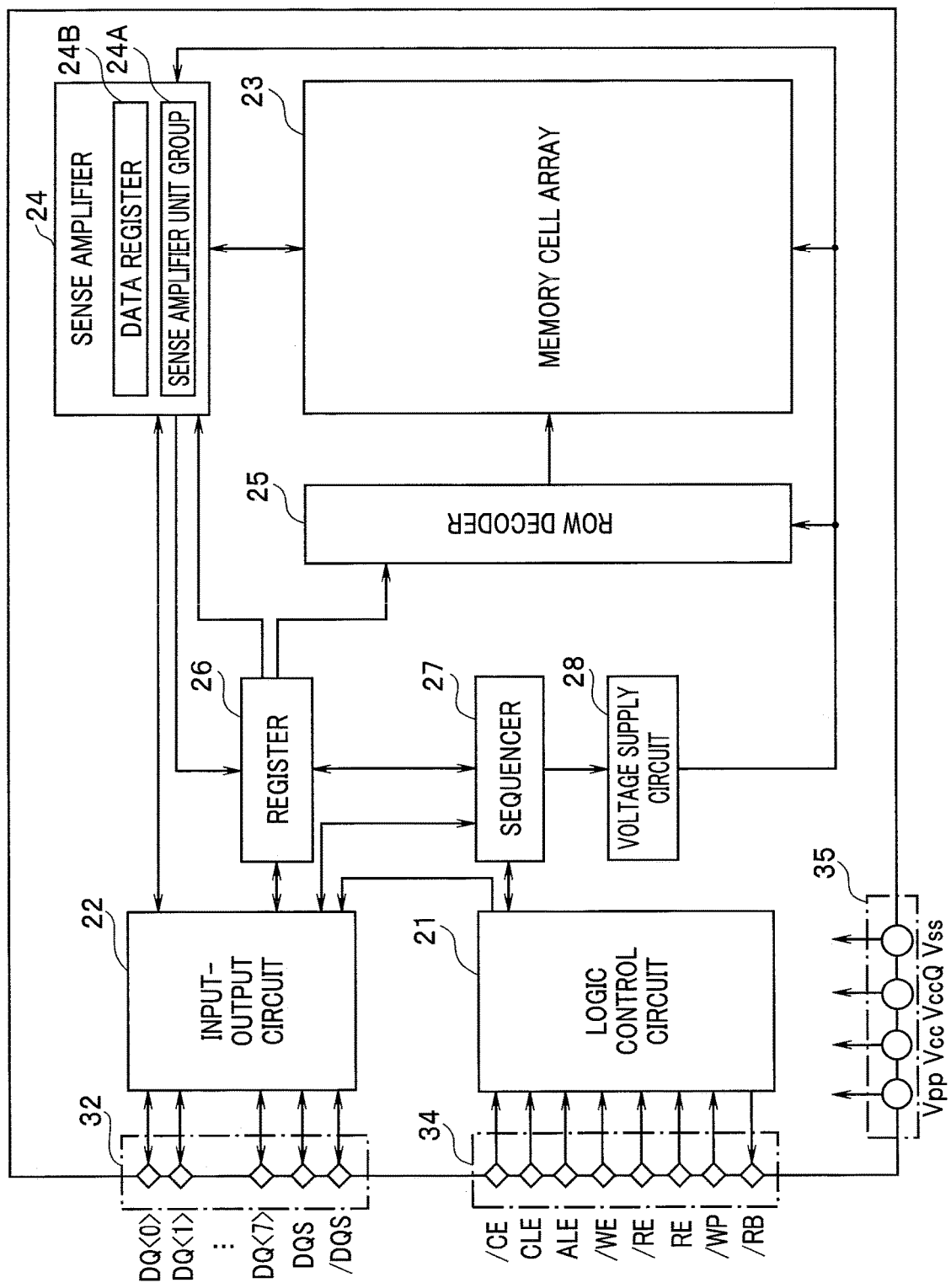
FIG. 2 is a block diagram illustrating an exemplary configuration of a non-volatile memory of the embodiment.

FIG. 2 is a block diagram illustrating an exemplary configuration of the non-volatile memory of the present embodiment. The non-volatile memory 2 includes a logic control circuit 21, an input-output circuit 22, a memory cell array 23, a sense amplifier 24, a row decoder 25, a register 26, a sequencer 27, a voltage supply circuit 28, an input-output pad group 32, a logic control pad group 34, and a power source inputting terminal group 35.

The memory cell array 23 includes a plurality of blocks. Each of these plurality of blocks BLK includes a plurality of memory cell transistors (memory cells). A plurality of bit lines, a plurality of word lines, a source line, and the like are disposed in the memory cell array 23 to control voltage applied to the memory cell transistors. A specific configuration of each block BLK will be described later.

The input-output pad group 32 includes a plurality of terminals (pads) corresponding to the signals DQ <7:0> and the data strobe signals DQS and /DQS to transmit and receive signals including data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP to transmit and receive signals to and from the memory controller 1.

The signal /CE enables selection of the non-volatile memory 2. The signal CLE enables latch of a command transmitted as a signal DQ at a command register. The signal ALE enables latch of an address transmitted as a signal DQ at an address register. The signal WE enables writing. The signal RE enables reading. The signal WP inhibits writing and erasure. The signal R/B indicates whether the non-volatile memory 2 is in the ready state (state in which a command from outside can be received) or the busy state (state in which a command from outside cannot be received). The memory controller 1 can know the state of the non-volatile memory 2 by receiving the signal R/B.

The power source inputting terminal group 35 includes a plurality of terminals through which power voltage Vcc, VccQ, and Vpp and ground voltage Vss are input to supply various kinds of operation power sources from outside to the non-volatile memory 2. The power voltage Vcc is circuit power voltage provided typically from outside as an operation power source and is input as voltage of, for example, 3.3 V approximately. The power voltage VccQ is input as voltage of, for example, 1.2 V. The power voltage VccQ is used to transmit and receive signals between the memory controller 1 and the non-volatile memory 2.

The power voltage Vpp is power voltage higher than the power voltage Vcc and is input as voltage of, for example, 12 V. High voltage of 20 V approximately is needed to write data to the memory cell array 23 or erase data. In this case, desired voltage can be generated faster with less electric power consumption by stepping up the power voltage Vpp of 12 V approximately than by stepping up the power voltage Vcc of 3.3 V approximately at a step-up circuit of the voltage supply circuit 28. The power voltage Vcc is a power source normally supplied to the non-volatile memory 2, and the power voltage Vpp is a power source additionally and optionally supplied in accordance with, for example, use environment.

The logic control circuit 21 and the input-output circuit 22 are connected to the memory controller 1 through a NAND bus. The input-output circuit 22 transmits and receives a signal DQ (for example, DQ0 to DQ7) through the NAND bus to and from the memory controller 1.

The logic control circuit 21 receives external control signals (for example, the chip enable signal /CE, the command latch enable signal CLE, the address latch enable signal ALE, the write enable signal /WE, the read enable signals RE and /RE, and the write protect signal /WP) from the memory controller 1 through the NAND bus. In addition, the logic control circuit 21 transmits the ready/busy signal /RB to the memory controller 1 through the NAND bus.

The input-output circuit 22 transmits and receives the signals DQ <7:0> and the data strobe signals DQS and /DQS to and from the memory controller 1. The input-output circuit 22 forwards commands and addresses in the signals DQ <7:0> to the register 26. The input-output circuit 22 also transmits and receives write data and read data to and from the sense amplifier 24.

The register 26 includes a command register, an address register, and a status register. The command register temporarily stores a command. The address register temporarily stores an address. The status register temporarily stores data necessary for operation of the non-volatile memory 2. The register 26 is configured as, for example, an SRAM.

The sequencer 27 as a control unit receives a command from the register 26 and controls the non-volatile memory 2 in accordance with a sequence based on the command.

The voltage supply circuit 28 receives power voltage from outside of the non-volatile memory 2 and generates a plurality of voltages necessary for write operation, read operation, and erasure operation by using the power voltage. The voltage supply circuit 28 supplies the generated voltages to the memory cell array 23, the sense amplifier 24, the row decoder 25, and the like.

The row decoder 25 receives a row address from the register 26 and decodes the row address. The row decoder 25 performs selection operation of a word line based on the decoded row address. Then, the row decoder 25 forwards a plurality of voltages necessary for write operation, read operation, and erasure operation to a selected block.

The sense amplifier 24 receives a column address from the register 26 and decodes the column address. The sense amplifier 24 includes a sense amplifier unit group 24A and a data register 24B. The sense amplifier unit group 24A is connected to the bit lines and selects either bit line based on a decoded column address. At data reading, the sense amplifier unit group 24A senses and amplifies data read from a memory cell transistor onto a bit line. At data writing, the sense amplifier unit group 24A forwards write data to a bit line.

At data reading, the data register 24B temporarily stores data detected by the sense amplifier unit group 24A and serially forwards the data to the input-output circuit 22. At data writing, the data register 24B temporarily stores data serially forwarded from the input-output circuit 22 and forwards the data to the sense amplifier unit group 24A. The data register 24B is configured as, for example, an SRAM.

(1-3. Block Configuration of Memory Cell Array)

Figure 3:
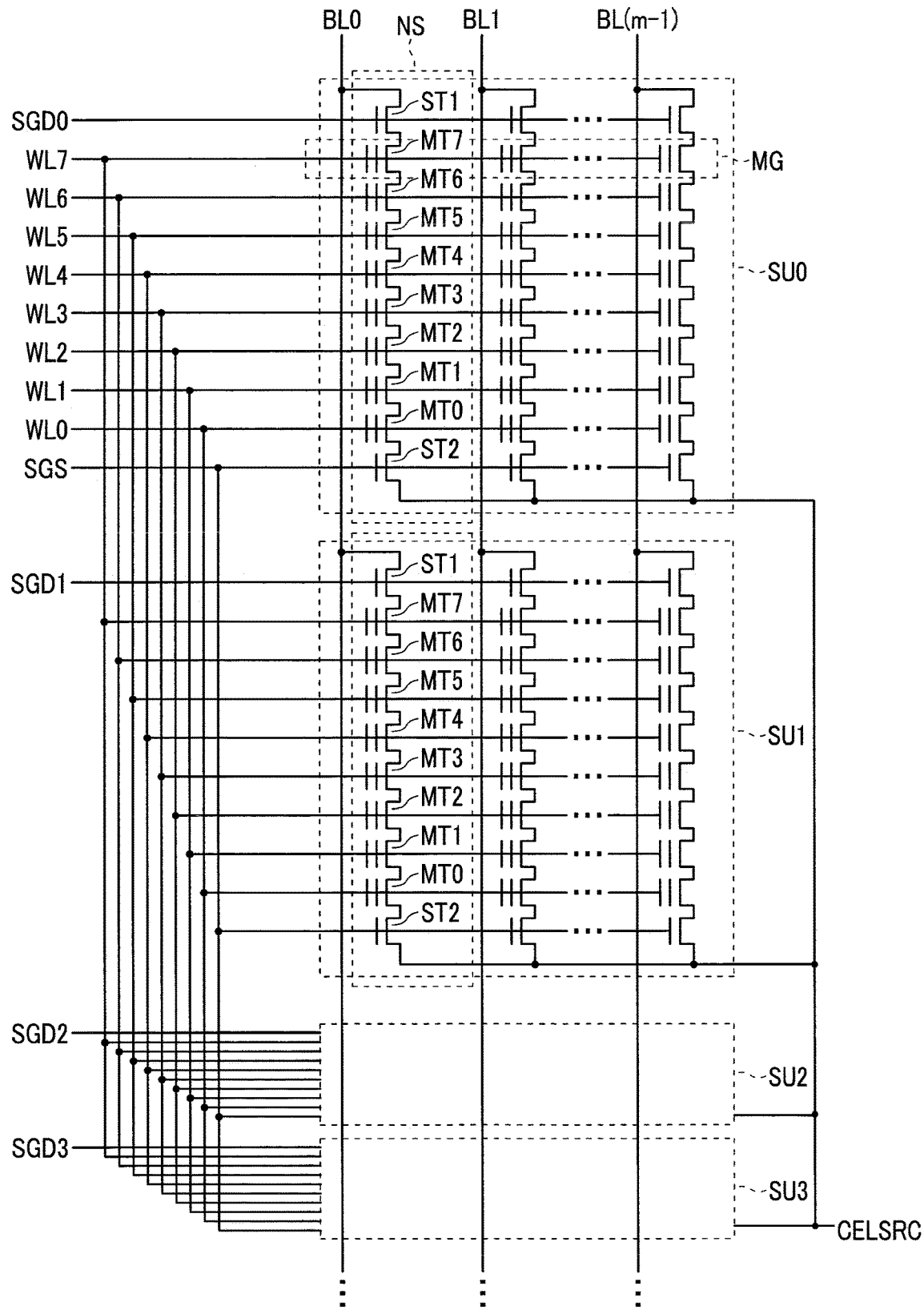
FIG. 3 is a diagram illustrating an exemplary configuration of a block of a NAND memory cell array having a three-dimensional structure.

FIG. 3 is a diagram illustrating an exemplary configuration of a block of the memory cell array 23 having a three-dimensional structure. FIG. 3 illustrates one block BLK among the plurality of blocks included in the memory cell array 23. Any other block of the memory cell array has a configuration same as the configuration in FIG. 3. Note that the present embodiment is also applicable to a memory cell array having a two-dimensional structure.

As illustrated, the block BLK includes, for example, four string units (SU0 to SU3). Each string unit SU includes a plurality of NAND strings NS. In this example, each NAND string NS includes eight memory cell transistors MT (MT0 to MT7) and select gate transistors ST1 and ST2. Each memory cell transistor MT includes a gate and an electric charge accumulation layer and stores data in a non-volatile manner. Note that, for sake of simplicity, the number of memory cell transistors MT included in each NAND string NS is eight but may be larger.

The select gate transistors ST1 and ST2 are each indicated as one transistor in terms of electric circuit but may be each integrated with a memory cell transistor in terms of structure. For example, to improve a cutoff characteristic, the select gate transistors ST1 and ST2 may each include a plurality of select gate transistors. In addition, a dummy cell transistor may be provided between a memory cell transistor MT and each of the select gate transistors ST1 and ST2.

The memory cell transistors MT are connected in series to each other and disposed between the select gate transistors ST1 and ST2. The memory cell transistor MT7 on one end side is connected to the select gate transistor ST1, and the memory cell transistor MT0 on the other end side is connected to the select gate transistor ST2.

Gates of the select gate transistors ST1 of the respective string units SU0 to SU3 are connected to select gate lines SGD0 to SGD3 (hereinafter referred to as select gate lines SGD when not needed to be distinguished from one another), respectively. Gates of the select gate transistors ST2 are connected to a select gate line SGS that is common to the plurality of string units SU in the same block BLK. Gates of the memory cell transistors MT0 to MT7 in the same block BLK are connected to word lines WL0 to WL7, respectively. In other words, the word lines WL0 to WL7 and the select gate line SGS are connected in common to the plurality of string units SU0 to SU3 in the same block BLK, but the select gate lines SGD are independently connected to the string units SU0 to SU3, respectively, in the same block BLK.

The gates of the memory cell transistors MT0 to MT7 included in each NAND string NS are connected to the word lines WL0 to WL7, respectively. The gates of memory cell transistors MTi on the same row in the block BLK are connected to the same word line WLi. Note that, in the following description, each NAND string NS is simply referred to as "string" in some cases.

Each NAND string NS is connected to a corresponding bit line. Thus, each memory cell transistor MT is connected to a bit line through the select gate transistors ST and the other memory cell transistors MT included in a corresponding NAND string NS. As described above, data at the memory cell transistors MT in the same block BLK is erased all at once. However, data reading and writing are performed per memory cell group MG (or per page). In the present specification, a memory cell group MG is defined to be a plurality of memory cell transistors MT connected to one word line WLi and belonging to one string unit SU. In read operation and write operation, one word line WLi and one select gate line SGD are selected in accordance with a physical address, and accordingly, a memory cell group MG is selected.

(1-4. Sectional Structure of Non-Volatile Memory)

Figure 4:
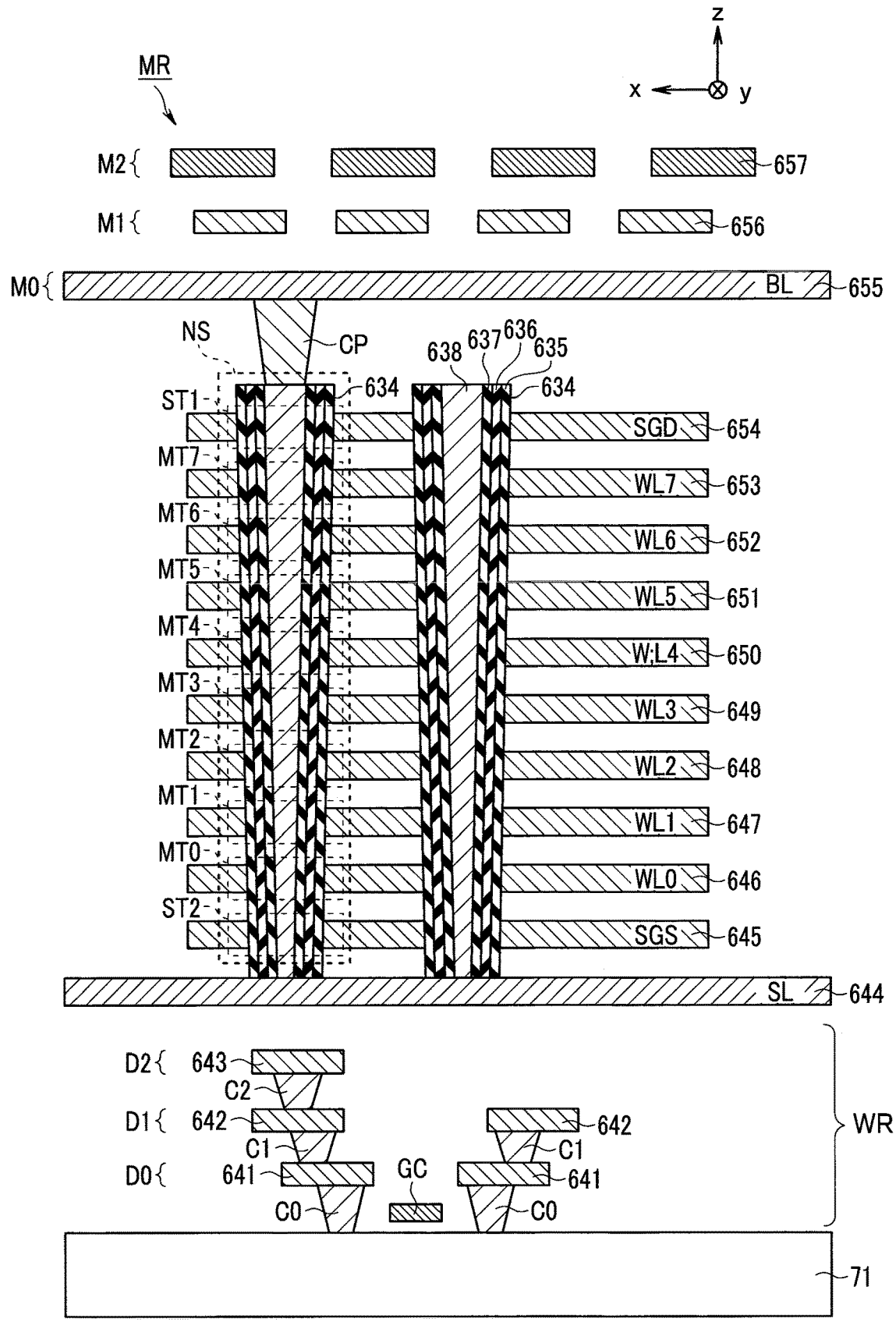
FIG. 4 is a cross-sectional view of a partial region of a semiconductor storage device according to the embodiment.

FIG. 4 is a cross-sectional view of a partial region of the semiconductor storage device according to the embodiment. FIG. 4 illustrates an example in which a peripheral circuit region corresponding to peripheral circuits such as the sense amplifier 24 and the row decoder 25 is provided on a semiconductor substrate 71 and a memory region is provided above the peripheral circuit region. Note that, in the following description, an x direction and a y direction are defined to be two directions horizontal to a surface of the semiconductor substrate 71 and orthogonal to each other, and a z direction is defined to be a direction perpendicular to the surface of the semiconductor substrate 71.

As illustrated in FIG. 4, the non-volatile memory includes the semiconductor substrate 71, electric conductors 641 to 657, a memory pillar 634, and contact plugs C0, C1, C2, and CP in a memory region MR. Note that the drawing to be described below omits illustrations of p-type or n-type well regions formed at an upper surface part of the semiconductor substrate 71, an impurity diffusion region formed in each well region, and gate insulating films and element separation regions each insulating the well regions from each other.

In the memory region MR, an electric conductor GC is provided on the semiconductor substrate 71 through a gate insulating film (not illustrated). In addition, for example, a plurality of contacts C0 are provided in a plurality of impurity diffusion regions (not illustrated), respectively, provided on the semiconductor substrate 71 to sandwich the electric conductor GC. The memory cell array 23 is disposed on the semiconductor substrate 71 through a wiring layer region WR.

The electric conductor 641, which forms a wiring pattern, is provided on each contact C0. For example, the electric conductor GC functions as a gate electrode of a transistor, and the electric conductor 641 functions as a source electrode or drain electrode of the transistor.

For example, the contact C1 is provided on each electric conductor 641. For example, the electric conductor 642 is provided on the contact C1. For example, the contact C2 is provided on the electric conductor 642. For example, the electric conductor 643 is provided on the contact C2.

Wiring patterns of the electric conductors 641, 642, and 643 are disposed in the wiring layer region WR between a sense amplifier circuit and the memory cell array, both not illustrated. Hereinafter, wiring layers in which the electric conductors 641, 642, and 643 are provided are referred to as wiring layers D0, D1, and D2, respectively. The wiring layers D0, D1, and D2 are provided at a lower layer part of the non-volatile memory 2. Note that, in this example, three wiring layers are provided in the wiring layer region WR, but two wiring layers or less, or four wiring layers or more may be provided in the wiring layer region WR.

The electric conductor 644 is provided above the electric conductor 643 through, for example, an interlayer insulating film. The electric conductor 644 is formed in, for example, a plate shape parallel to an xy plane and functions as a source line SL. For example, the electric conductors 645 to 654 corresponding to each NAND string NS are sequentially stacked above the electric conductor 644. A non-illustrated interlayer insulating film is provided between each pair of adjacent electric conductors in the z direction among these electric conductors.

The electric conductors 645 to 654 are each formed in, for example, a plate shape parallel to the xy plane. For example, the electric conductor 645 functions as the select gate line SGS, the electric conductors 646 to 653 function as the word lines WL0 to WL7, respectively, and the electric conductor 654 functions as the select gate line SGD.

Each memory pillar 634 has a column shape, penetrates through each of the electric conductors 645 to 654, and contacts the electric conductor 644. The memory pillar 634 includes, for example, an electric conductor column 638 on a center side, a tunnel insulating film 637 formed on an outer side of the electric conductor column 638, an electric charge accumulation film 636 formed on the outer side of the tunnel insulating film 637, and a block insulating film 635 formed on the outer side of the electric charge accumulation film 636.

For example, a part at which the memory pillar 634 intersects the electric conductor 645 functions as the select gate transistor ST2. A part at which the memory pillar 634 intersects each of the electric conductors 646 to 653 functions as a memory cell transistor (memory cell) MT. A part at which the memory pillar 634 intersects the electric conductor 654 functions as the select gate transistor ST1.

The electric conductor 655 is provided in a layer above an upper surface of the memory pillar 634 through an interlayer insulating film. The electric conductor 655 is formed in a line shape extending in the x direction and corresponds to a bit line BL. A plurality of electric conductors 655 are arrayed at intervals in the y direction (not illustrated). The electric conductor 655 is electrically connected, for each string unit SU, to the electric conductor column 638 in the corresponding one memory pillar 634.

Specifically, in each string unit SU, for example, the contact plug CP is provided on the electric conductor column 638 in each memory pillar 634, and one electric conductor 645 is provided on the contact plug CP. Note that the present embodiment is not limited to such a configuration, but the electric conductor column 638 and the electric conductor 655 in the memory pillar 634 may be connected to each other through a plurality of contacts and wires or the like.

The electric conductor 656 is provided, through an interlayer insulating film, in a layer above the layer in which the electric conductor 655 is provided. The electric conductor 657 is provided, through an interlayer insulating film, in a layer above the layer in which the electric conductor 656 is provided.

The electric conductors 656 and 657 correspond to, for example, a wire provided in the memory cell array and a wire for connecting the peripheral circuits provided below the memory cell array. The electric conductors 656 and 657 may be connected to each other through a non-illustrated column-shaped contact. In this example, the layer in which the electric conductor 655 is provided is referred to as a wiring layer M0, the layer in which the electric conductor 656 is provided is referred to as a wiring layer M1, and the layer in which the electric conductor 657 is provided is referred to as a wiring layer M2.

As illustrated in FIG. 4, in the semiconductor storage device of the embodiment, the wiring layers D0, D1, and D2 are formed below each string unit SU. The wiring layers M0, M1, and M2 are formed above each string unit SU. The wiring layers D0, D1, and D2 are tungsten wires formed by, for example, a damascene method.

The wiring layer M2 is, for example, an aluminum wire formed by anisotropic etching such as reactive ion etching (RIE). The wiring layer M2 has a large film thickness and a low resistance, and thus key power source wires (Vcc, Vss) are allocated to the wiring layer M2. The wiring layer M1 is, for example, a copper (Cu) wire formed by the damascene method. The Cu wire has high wiring reliability in, for example, electro migration (EM) resistance, and a signal line through which data needs to be reliably transferred is allocated to the wiring layer M1. The wiring layer M0 is, for example, a Cu wire formed by the damascene method. The wiring layer M0 is used as the bit line BL, and part of the key power source wires is allocated to the wiring layer M0 for power source reinforcement. Note that a wire such as a signal line other than the key power source wires preferably has a resistance as low as possible and thus is formed by using an upper wiring layer (for example, the wiring layer M2) when possible.

(1-5. Threshold Voltage Distributions of Memory Cell Transistor)

Figures 5, 6:
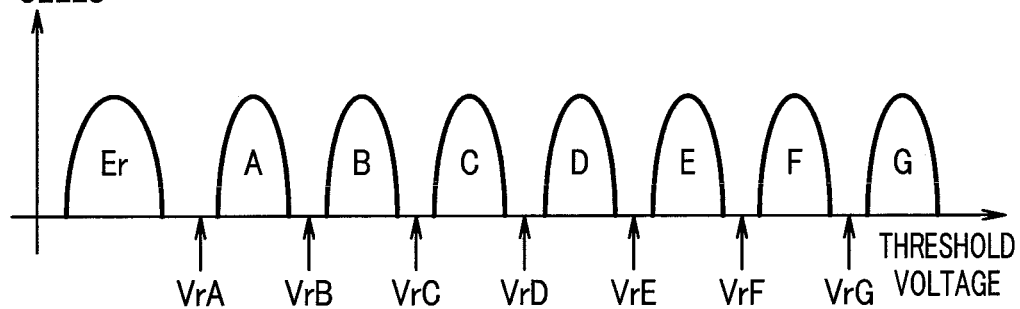
FIG. 5 is a diagram illustrating an example of threshold voltage distributions of the non-volatile memory.
FIG. 6 is a diagram illustrating data coding of the embodiment.

FIG. 5 is a diagram illustrating an example of threshold voltage distributions of the non-volatile memory. FIG. 5 illustrates a threshold voltage distribution example of the 3 bit/Cell non-volatile memory 2. The non-volatile memory 2 stores information as an amount of electric charge stored in the electric charge accumulation layer of each memory cell. The memory cell has a threshold voltage in accordance with the amount of electric charge. A plurality of data values stored in the memory cell are associated with a plurality of respective regions (threshold voltage distribution regions) of the threshold voltage.

In FIG. 5, eight distributions (lobes) denoted by Er, A, B, C, D, E, F, and G correspond to eight threshold voltage distribution regions. In this manner, each memory cell has threshold voltage distributions divided by seven boundaries. In FIG. 5, a horizontal axis represents the threshold voltage, and a vertical axis represents distribution of the number of memory cells (the number of cells).

In the present embodiment, the region Er is defined to be a region in which the threshold voltage is equal to or lower than VrA, the region A is defined to be a region in which the threshold voltage is higher than VrA and equal to or lower than VrB, the region B is defined to be a region in which the threshold voltage is higher than VrB and equal to or lower than VrC, and the region C is defined to be a region in which the threshold voltage is higher than VrC and equal to or lower than VrD. In addition, in the present embodiment, the region D is defined to be a region in which the threshold voltage is higher than VrD and equal to or lower than VrE, the region E is defined to be a region in which the threshold voltage is higher than VrE and equal to or lower than VrF, the region F is defined to be a region in which the threshold voltage is higher than VrF and equal to or lower than VrG, and the region G is defined to be a region in which the threshold voltage is higher than VrG.

The threshold voltage distributions corresponding to the regions Er, A, B, C, D, E, F, and G are referred to as distributions Er, A, B, C, D, E, F, and G (first to eighth distribution), respectively. The voltages VrA to VrG are threshold voltages as the boundaries of the regions.

In the non-volatile memory 2, a plurality of data values are associated with the plurality of respective threshold voltage distribution regions of each memory cell. This association is referred to as data coding. The data coding is determined in advance, and at data writing (programming), electric charge is injected into the memory cell based on the data coding so that the threshold voltage is in a threshold voltage distribution region in accordance with a data value to be stored. At reading, read voltage is applied to the memory cell, and data is determined based on whether the threshold voltage of the memory cell is lower or higher than the read voltage.

FIG. 6 is a diagram illustrating the data coding of the embodiment. In the present embodiment, the eight threshold voltage distribution regions illustrated in FIG. 5 are associated with eight three-bit data values, respectively. The threshold voltage and data values of bits corresponding to Upper, Middle, and Lower pages have a relation as described below.

The memory cell stores "111" when the threshold voltage is in the region Er.
The memory cell stores "101" when the threshold voltage is in the region A.
The memory cell stores "001" when the threshold voltage is in the region B.
the memory cell stores "011" when the threshold voltage is in the region C.
The memory cell stores "010" when the threshold voltage is in the region D.
The memory cell stores "110" when the threshold voltage is in the region E.
The memory cell stores "100" when the threshold voltage is in the region F.
The memory cell stores "000" when the threshold voltage is in the region G.

In this manner, the regions of the threshold voltage can indicate the states of three-bit data in each memory cell. Note that the threshold voltage of the memory cell is in the region Er in a state in which the memory cell is not written (state of "erased"). In the above-described code, only one bit of data changes between any two adjacent states, for example, as data "111" is stored in the state Er (erasure) and data "101" is stored in the state A. In this manner, the coding illustrated in FIG. 6 is gray code that only one bit of data changes between any two adjacent regions.

Note that the example in which the eight states are discretely distributed is described with reference to FIG. 5, but this is, for example, an ideal state right after data writing. Thus, in reality, adjacent states potentially overlap each other. For example, after data writing, an upper end of the distribution Er and a lower end of the distribution A overlap each other due to disturbance or the like in some cases. In such a case, data is corrected by using, for example, an ECC technology.

(2. Operation)

Subsequently, data write operation and read operation in the present embodiment will be described below.

(2-1. Concept of Write Operation)

First, the write operation according to the present embodiment will be briefly described. The write operation roughly includes program operation and verify operation. When multiple-value data is to be written to a memory cell transistor MT, the threshold voltage of the memory cell transistor MT is set to be a value in accordance with a value of the data. When program voltage VPGM and bit line voltage Vb1 are applied to the memory cell transistor MT, electrons are injected into the electric charge accumulation film of the memory cell transistor MT and the threshold voltage increases. When the program voltage VPGM is increased to increase an amount of injected electrons, the threshold voltage of the memory cell transistor MT can be increased. However, an amount of injected electrons is different among memory cell transistors MT due to variance among the memory cell transistors MT even when the same program voltage VPGM is applied. Once injected, electrons are held until erasure operation is performed. Thus, the program operation and the verify operation (loop) are performed a plurality of times along with gradual increase of the program voltage VPGM so that the threshold voltage set to each memory cell transistor MT is in an allowable range of the threshold voltage.

The program operation is operation that increases the threshold voltage by injecting electrons into the electric charge accumulation layer (or maintains the threshold voltage by inhibiting the injection). Hereinafter, the operation that increases the threshold voltage is referred to as ""0" programming" or ""0" writing", and data "0" is provided to a bit line BL as a "0" programming target. The operation that maintains the threshold voltage is referred to as "1" "programming", "1" "writing", or "writing inhibition", and data "1" is provided to a bit line BL as a "1" programming target.

The verify operation is read operation performed as part of the write operation. The verify operation is operation that determines whether the threshold voltage of a memory cell transistor MT has reached a target level by reading data after the program operation. A memory cell transistor MT, the threshold voltage of which has reached the target level is then set to writing inhibition. Combination of the program operation and the verify operation described above is repeated to increase the threshold voltage of the memory cell transistor MT to the target level.

(2-2. Program Operation)

Figure 7A:
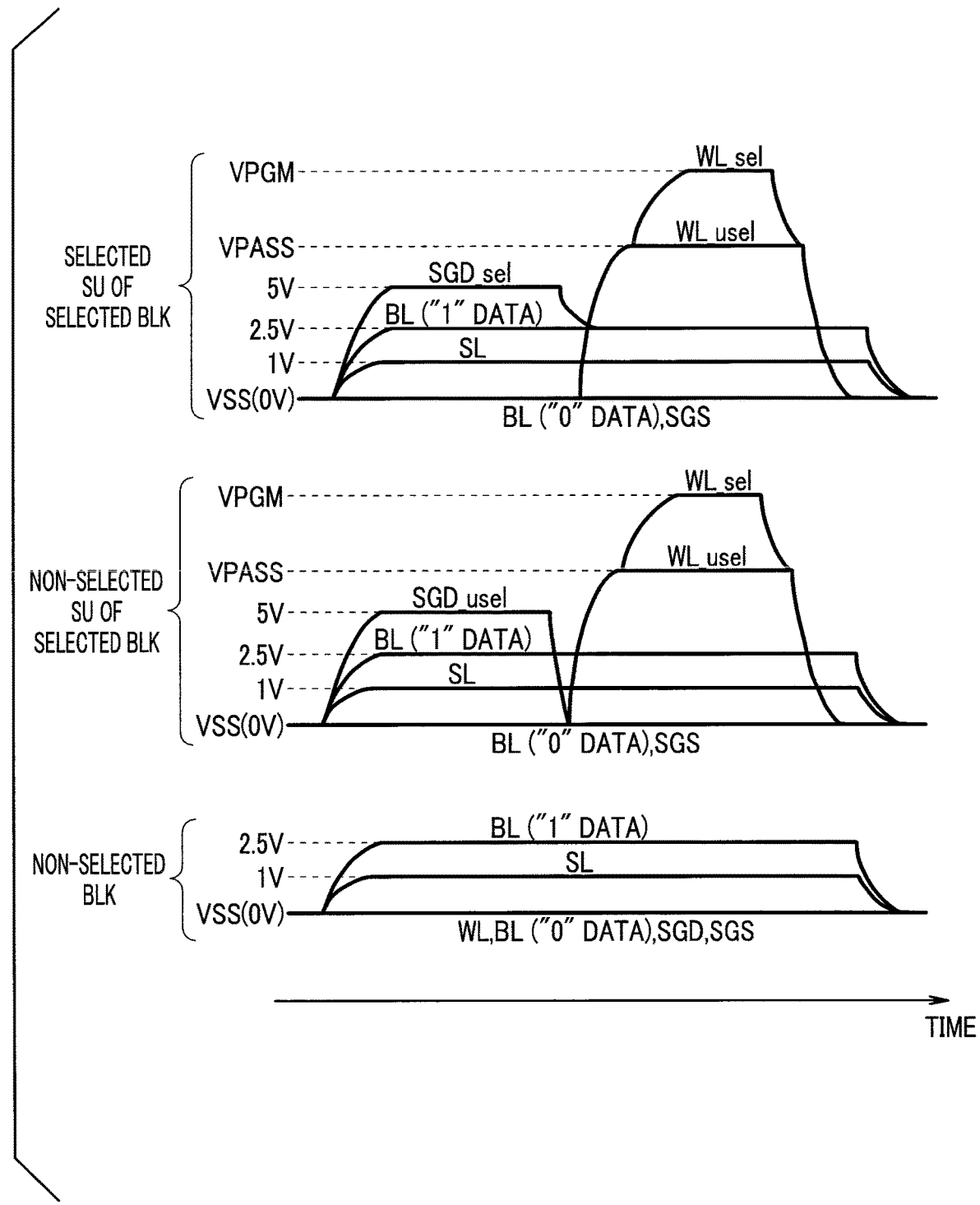
FIG. 7A is a diagram illustrating voltage change at each wire in program operation.

FIG. 7A is a diagram illustrating voltage change at each wire in the write operation (program operation). Note that each voltage illustrated in FIG. 7A is generated by the voltage supply circuit 28 under control of the sequencer 27.

The program operation is performed in accordance with the program voltage and the bit line voltage applied to a word line and a bit line. For a writing target string unit SU (selected SU) of a writing target block BLK (selected BLK), a select gate line SGD (SGD_sel) is set to, for example, 5 V to conduct electricity through the select gate transistor ST1 before application of the program voltage VPGM. In the program operation, the select gate line SGS is at, for example, 0 V. Thus, the select gate transistor ST2 is off. Thereafter, the select gate line SGD (SGD_sel) is set to, for example, 2.5 V at application of the program voltage VPGM. Accordingly, a state of conduction through the select gate transistor ST1 is determined by the bit line voltage of the bit line BL connected to the select gate transistor ST1.

For a non-writing target string unit SU (non-selected SU) of a writing target block BLK (selected BLK), a select gate line SGD (SGD_usel) is set to, for example, 5 V to conduct electricity through the select gate transistor ST1 before application of the program voltage VPGM. Thereafter, the select gate line SGD (SGD_usel) is set to, for example, 0 V at application of the program voltage VPGM. Accordingly, the select gate transistor ST1 conducts no electricity and is electrically disconnected from the bit line BL.

Note that, in a non-writing target block BLK (non-selected BLK), "0" is applied to each select gate line SGD and the select gate line SGS. Accordingly, each select gate transistor ST1 and each select gate transistor ST2 are turned off.

As described above, the sense amplifier 24 forwards data to each bit line BL. The ground voltage Vss of, for example, 0 V is applied as bit line voltage Vbl_L to a bit line BL provided with data "0". Writing inhibition voltage Vinhibit (for example, 2.5 V) is applied as a bit line voltage Vbl_H to a bit line BL provided with data "1". Thus, at application of the program voltage VPGM, each select gate transistor ST1 connected to the bit line BL provided with data "0" conducts electricity, and each select gate transistor ST1 connected to the bit line BL provided with data "1" is cut off. The memory cell transistor MT connected to each select gate transistor ST1 being cut off is set to writing inhibition.

In the memory cell transistor MT connected to each select gate transistor ST1 set to a conducting state, electrons are injected into the electric charge accumulation film in accordance with voltage applied to the corresponding word line WL. Each memory cell transistor MT connected to a word line WL provided with voltage VPASS as word line voltage becomes a conducting state irrespective of the threshold voltage, but no electrons are injected into the electric charge accumulation film. In each memory cell transistor MT connected to a word line WL provided with the program voltage VPGM as word line voltage, electrons are injected into the electric charge accumulation film in accordance with the program voltage VPGM.

Figure 8:
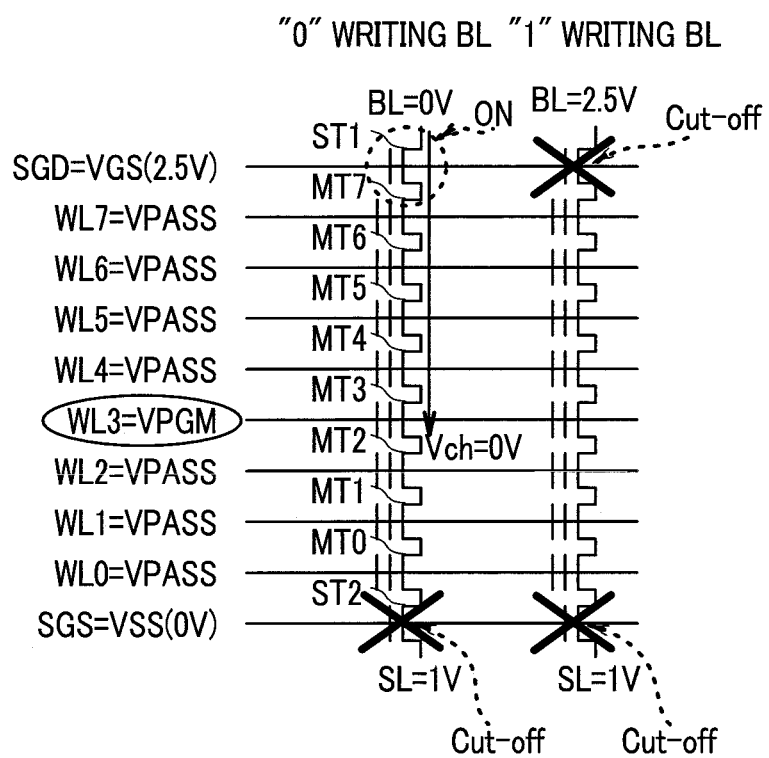
FIG. 8 is a circuit diagram illustrating statuses of strings in program operation.

Specifically, the row decoder 25 selects either word line WL in a selected BLK, applies the program voltage VPGM to the select word line, and applies the voltage VPASS to any other word line (non-select word line) WL. The program voltage VPGM is high voltage for injecting electrons into the electric charge accumulation film by a tunneling phenomenon, and VPGM>VPASS holds. FIG. 8 illustrates a status of a string unit SU in this case.

FIG. 8 is a circuit diagram illustrating a status of strings in the program operation. FIG. 8 illustrates two NAND strings corresponding to a "0" writing target bit line BL and a "1" writing target bit line BL. The illustrated diagram corresponds to a status when the word line WL3 is selected.

As illustrated, the voltage VPGM is applied to the select word line WL3, and the voltage VPASS is applied to the non-select word lines WL0 to WL2 and WL4 to WL7.

Accordingly, in the NAND string corresponding to the "0" writing target bit line BL, the select gate transistor ST1 is turned on. Thus, channel voltage Vch of the memory cell transistor MT3 connected to the select word line WL3 becomes 0 V. In other words, voltage difference between a control gate and a channel increases, and as a result, electrons are injected into the electric charge accumulation layer and the threshold voltage of the memory cell transistor MT3 is increased.

In the NAND string corresponding to the "1" writing target bit line BL, the select gate transistor ST1 is cut off. Thus, the channel of the memory cell transistor MT3 connected to the select word line WL3 becomes electrically floating, and the channel voltage Vch is increased close to the voltage VPGM due to capacitive coupling with the word line WL and the like. In other words, the voltage difference between the control gate and the channel decreases, and as a result, no electrons are injected into the electric charge accumulation layer and the threshold voltage of the memory cell transistor MT3 is maintained (the threshold voltage does not vary enough to cause transition of a threshold voltage distribution level to a higher distribution).

In this manner, the write operation (program operation) is performed on each memory cell transistor MT in the memory cell array 23 as voltage of the corresponding word line WL is controlled by the row decoder 25 and data is supplied to the corresponding bit line BL by the sense amplifier 24.

(2-3. Read Operation (Verify Operation))

Figure 7B:
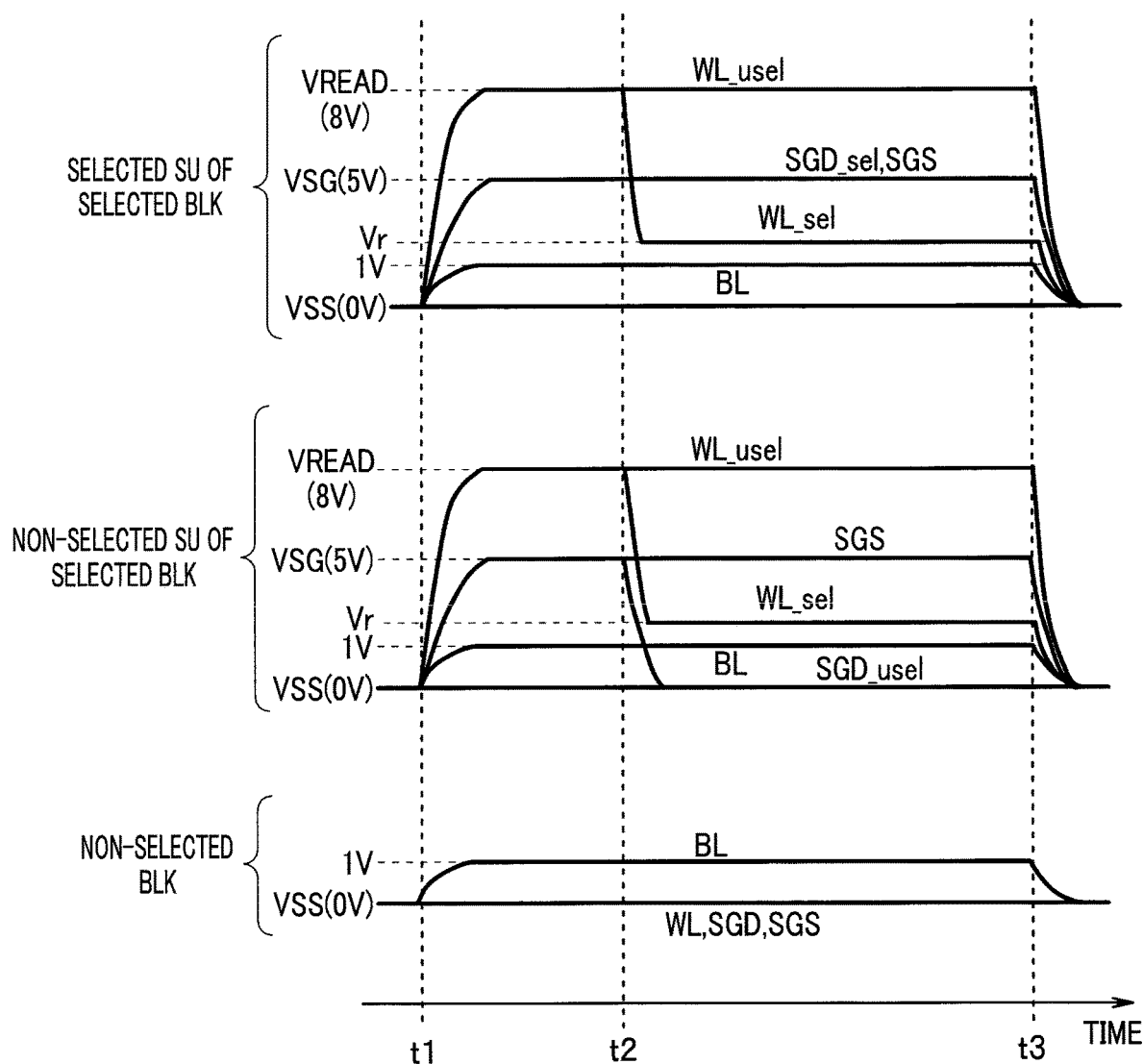
FIG. 7B is a diagram illustrating voltage change at each wire in read operation.

FIG. 7B is a diagram illustrating voltage change at each wire in the read operation (verify operation). Note that each voltage illustrated in FIG. 7B is generated by the voltage supply circuit 28 under control of the sequencer 27. The read operation, that is, data reading from a multivalued memory cell transistor is performed as the row decoder 25 applies read voltage Vr to a select word line WL (hereinafter also referred to as WL_sel) of a selected block and the sense amplifier 24 senses data read onto a bit line BL and determines whether the read data is "0" or The read operation has a disturbance prevention duration (time point t1 to time point t2; hereinafter referred to as an USTRDIS duration) and an actual reading duration (time point t2 to time point t3; hereinafter referred to as an actual reading duration). In the USTRDIS duration, all-channel conduction is performed at start of actual read operation to prevent disturbance (unintended increase of the threshold voltage). Specifically, when a cell belonging to the select word line WL_sel is not turned on in a non-selected string unit of the selected block, voltage on a drain side is boosted and voltage on a source side becomes equal to VCELSRC, and accordingly, a large voltage difference occurs. In this case, such a phenomenon occurs that hot carrier injection (HCI) occurs and a threshold value of a nearby cell changes. As a countermeasure for this, the select gate line SGD_usel on the drain side in the non-selected string unit is turned on to remove the boosted voltage, thereby preventing voltage difference between the drain side and the source side. Accordingly, unintended increase of the threshold voltage is prevented.

The row decoder 25 applies voltage VSG (for example, 5 V) for turning on the select gate transistors ST1 and ST2 to the select gate line SGD_sel, SGD_usel, and SGS of the selected block. The row decoder 25 also applies sufficiently high voltage VREAD (for example, 8 V) necessary for turning on each memory cell transistor to the select word line WL_sel of the selected block and the other non-select word lines WL_usel of the selected block. Note that voltage VREADK slightly higher than the voltage VREAD may be applied to a word line (adjacent word line) adjacent to the select word line WL_sel to facilitate conduction of each memory cell transistor connected to the adjacent word line.

In the actual reading duration, the select gate lines SGD_sel and SGS of a selected string unit of the selected block are maintained at the voltage VSG (for example, 5 V). The select gate line SGD_usel of a non-selected string unit of the selected block decreases to the voltage Vss (for example, 0 V) for turning off the select gate transistor ST1. In the actual reading duration, the row decoder 25 applies the read voltage Vr to the select word line WL_sel of the selected block and applies the voltage VREAD or VREADK to the other non-select word lines WL_usel of the selected block. In the read operation, the sense amplifier 24 fixes a bit line BL to constant voltage (for example, 1 V) and charges a non-illustrated sense node SEN inside the sense amplifier unit group 24A to predetermined precharge voltage Vpre higher than the voltage of the bit line BL. In this state, the logic control circuit 21 connects the sense node SEN to the bit line BL. Accordingly, current flows from the sense node SEN to the bit line BL, and the voltage of the sense node SEN gradually decreases.

The voltage of the sense node SEN changes in accordance with a state of the threshold voltage of each memory cell transistor connected to the corresponding bit line BL. Specifically, when the threshold voltage of the memory cell transistor is lower than the read voltage, the memory cell transistor is on, large cell current flows through the memory cell transistor, and the voltage of the sense node SEN decreases at higher speed. When the threshold voltage of the memory cell transistor is higher than the read voltage, the memory cell transistor is off, small or no cell current flows through the memory cell transistor, and the voltage of the sense node SEN decreases at slower speed.

Such difference in the decrease speed of the voltage of the sense node SEN is used to determine a writing state of the memory cell transistor, and a result of the determination is stored in a data latch circuit. For example, whether the voltage of the sense node SEN is at a low level (hereinafter also referred to as "L") or a high level (hereinafter also referred to as "H") is determined at a first time point when a predetermined first duration has elapsed since discharging start at which electric charge at the sense node SEN starts discharging. For example, when the threshold voltage of the memory cell transistor is lower than the read voltage, the memory cell transistor is completely on and large cell current flows through the memory cell transistor. Accordingly, the voltage of the sense node SEN rapidly decreases, a voltage decrease amount is relatively large, and the sense node SEN becomes "L" at the first time point.

When the threshold voltage of the memory cell transistor is higher than the read voltage, the memory cell transistor is off and extremely small or no cell current flows through the memory cell transistor. Accordingly, the voltage of the sense node SEN extremely gradually decreases, the voltage decrease amount is relatively small, and the sense node SEN remains at "H" at the first time point.

In this manner, whether the threshold voltage of a memory cell transistor is higher or lower than the read voltage Vr is determined as the row decoder 25 applies the read voltage to the select word line WL_sel of a selected block and the sense amplifier circuit monitors a state of the sense node SEN. Thus, when voltage between states is applied as the read voltage to the select word line WL_sel, a state of each memory cell transistor can be determined and data allocated to the state can be read.

For example, 3 bits of data per memory cell transistor can be stored in a TLC by allocating data to each of the threshold voltage distributions of eight lobes of the TLC. Writing is performed at each memory cell transistor in any of states Er, A, B, . . . , and G corresponding to the eight threshold voltage distributions, respectively. At reading, the value of data in each memory cell transistor can be determined by applying the voltages VrA to VrG. Note that, in the following description, the read voltage applied to the select word line WL_sel in the verify operation is referred to as voltages VfyA to VfyG.

Note that, in an entire duration (t1 to t3) of the read operation, the row decoder 25 applies the voltage Vss (for example, 0 V) to the word lines WL and the select gate lines SGD and SGS of each non-selected block.

(2-4. Specific Example of Write Operation)

A standard writing sequence will be more specifically described below with reference to FIG. 9. FIG. 9 illustrates an example in which data is written as combination of the program operation and the verify operation is repeated 19 times. This repetition operation is referred to as "loop".

FIG. 9 lists target states of the verify operation performed in each loop. As illustrated, the verify operation is performed only for the state "A" in the first and second loops. Specifically, in the verify operation, the voltage VfyA is applied to the select word line WL_sel, but the voltages VfyB to VfyG are not applied. In the subsequent third and fourth loops, the verify operation is performed for the state "A" and the state "B". Specifically, in the verify operation, the voltages VfyA and VfyB are sequentially applied to the select word line WL_sel, but the voltages VfyC to VfyG are not applied.

In the fifth and sixth loops, the verify operation is performed for the state "A", the state "B", and the state "C". Specifically, in the verify operation, the voltages VfyA, VfyB, and VfyC are sequentially applied to the select word line WL_sel, but the voltages VfyD to VfyG are not applied. The verify operation for the state "A" is completed on the sixth loop. This is because it is empirically known that, for example, programming to the state "A" is substantially completed in six loops.

In the seventh and eighth loops, the verify operation is performed for the state "B", the state "C", and the state "D". Specifically, in the verify operation, the voltages VfyB, VfyC, and VfyD are sequentially applied to the select word line WL_sel. The verify operation for the state "B" is completed on the eighth write operation. Further, in the ninth and tenth loops, the verify operation is performed for the state "C", the state "D", and the state "E". Specifically, in the verify operation, the voltages VfyC, VfyD, and VfyE are sequentially applied to the select word line WL_sel. The verify operation for the state "C" is completed on the tenth loop. Subsequently, writing is similarly performed up to the state "G", and the loop is repeated 19 times at maximum.

Figure 10:
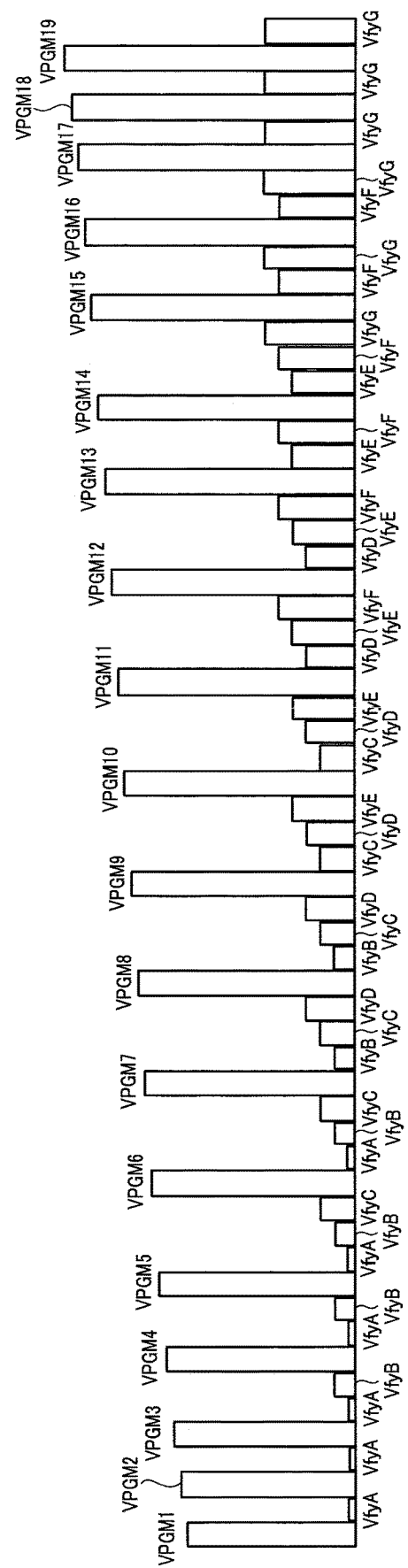
FIG. 10 is a diagram illustrating timings of program operation and verify operation in write operation based on the standard writing sequence.

FIG. 10 is a diagram illustrating timings of the program operation and the verify operation in the write operation based on the above-described standard writing sequence. As illustrated in FIG. 10, in the first and second loops, the verify operation is performed only for the state "A". Specifically, the verify operation is performed once for each program operation. In the third and fourth loops, the verify operation is performed for the state "A" and the state "B". Specifically, the verify operation is performed twice for each program operation. In the fifth loop to the twelfth loop in which the verify operation for the state "D" is completed, the verify operation is performed three times for each program operation. Subsequently, the verify operation for a set predetermined state is performed for each program operation. Eventually in the 19 loops, the program operation is performed 19 times and the verify operation is performed 42 times.

Note that the above description assumes that the verify operation is performed up to an upper limit number of times. As illustrated in FIG. 9, the verify operation for the state "A" is performed six times at maximum through the first to sixth loops. The verify operation for the state "B" is performed six times at maximum through the third to eighth loops. This is same for the other states. For example, there are a plurality of memory cell transistors MT written at the state "A", and there are also a plurality of bit lines BL ("A") connected to the memory cell transistors MT. Thus, in a precise sense, for example, when all memory cell transistors MT written at the state "A" have passed the verify operation for the state "A" in the fifth loop, the verify operation may not be performed for each bit line BL ("A") in the sixth loop. This is also true for description below.

The voltage VPGM applied to the select word line WL_sel through the program operation for the first time, an increased amount of the voltage VPGM in the program operation for the second time or later, and a loop at which the verify operation for each state starts are set based on an assumption of a worst case of fast writing, and sufficient margins are allocated to prevent writing beyond a target level.

The number of loops in the write operation, the voltage (voltage VPGM) of the select word line WL_sel in each loop, and a verify operation target state in each loop, which are described above, are stored as the standard writing sequence in the sequencer 27. When the write operation is to be performed on the memory cell array 23 based on the standard writing sequence, the sequencer 27 outputs a control signal based on the standard writing sequence to the sense amplifier 24 and the row decoder 25.

(2-5. Voltage Control of Each Wire in Read Operation)

Figure 11:
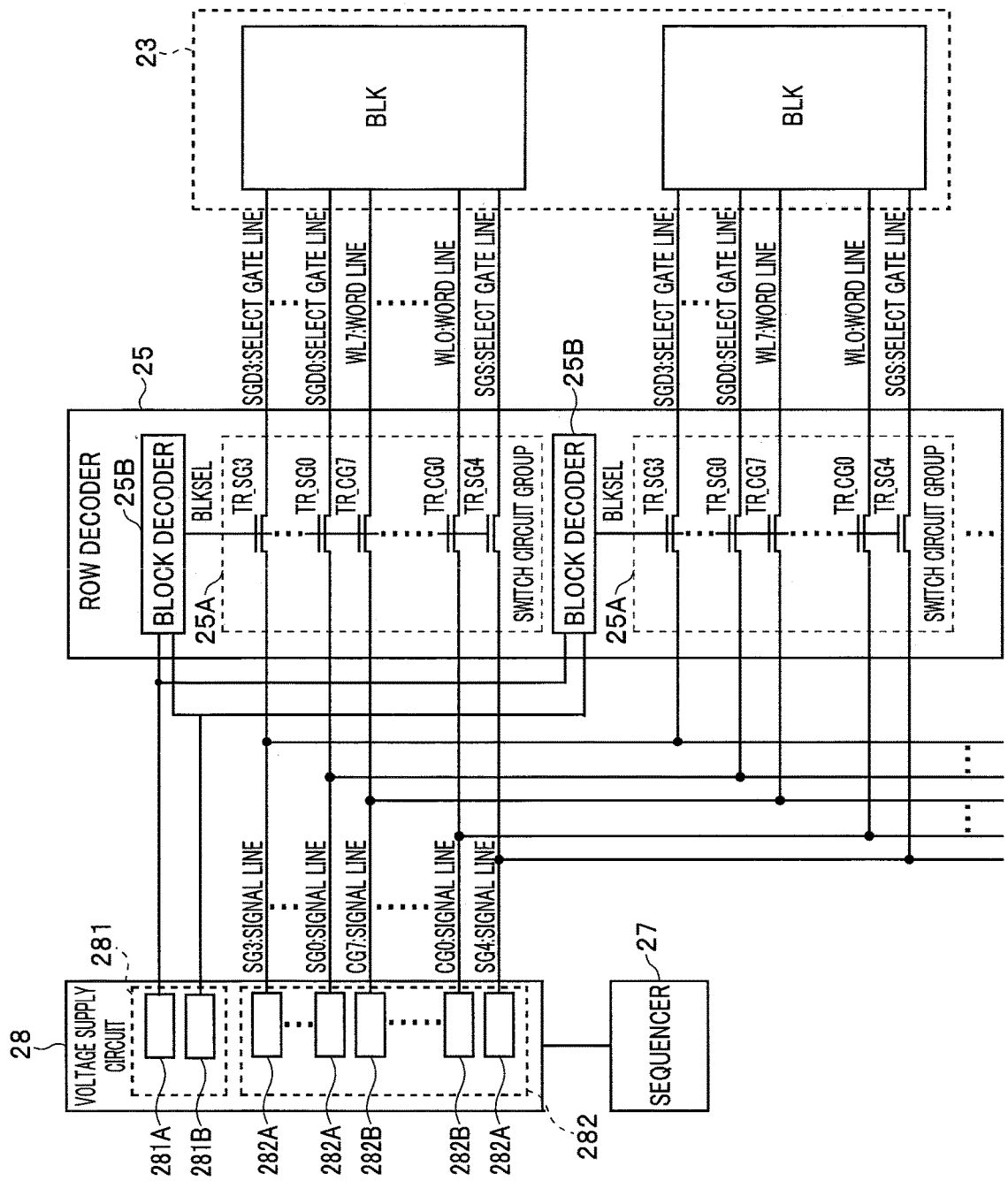
FIG. 11 is a block diagram illustrating an example of configurations of a voltage supply circuit 28 and a row decoder 25.

Subsequently, generation and control of voltage applied to each wire in the read operation will be described below with reference to FIG. 11. FIG. 11 is a block diagram illustrating an example of configurations of the voltage supply circuit 28 and the row decoder 25. Note that FIG. 11 illustrates only a configuration of part of the voltage supply circuit 28.

In FIG. 11, the voltage supply circuit 28 is controlled by the sequencer 27 and generates various voltages including voltage necessary for, for example, the program operation and the read operation on memory cell transistors MT. The voltage supply circuit 28 includes a voltage generation circuit 281 and a voltage adjustment circuit 282. The voltage generation circuit 281 generates internal voltage necessary for operation of the non-volatile memory 2. The voltage generation circuit 281 includes a BDH power voltage generation circuit 281A and a BDL power voltage generation circuit 281B. The BDH power voltage generation circuit 281A generates high-level power voltage (VRD) used at a block decoder 25B of the row decoder 25. The BDL power voltage generation circuit 281B generates low-level power voltage (VBB) used at the block decoder 25B. Note that the power voltage VBB is negative voltage.

The voltage adjustment circuit 282 generates various voltages necessary for operation of components of the non-volatile memory 2 by using voltage input through the power source inputting terminal group 35 and voltage generated by the voltage generation circuit 281. Then, the voltage adjustment circuit 282 selects appropriate voltage from among the generated voltages and supplies the voltage to signal lines SG0 to SG4 and signal lines CG0 to CG7. The voltage adjustment circuit 282 includes an SG driver 282A configured to supply voltage to the signal lines SG0 to SG4, and a plurality of CG drivers 282B configured to supply voltage to the signal lines CG0 to CG7, respectively. The signal lines SG0 to SG4 and CG0 to CG7 are branched through the row decoder 25 and connected to wires of each block BLK. Specifically, the signal lines SG0 to SG3 function as global drain side select gate lines and are connected to the select gate lines SGD0 to SGD3 as local select gate lines in each block BLK through the row decoder 25. The signal lines CG0 to CG7 function as global word lines and are connected to the word lines WL0 to WL7 as local word lines in each block BLK through the row decoder 25. The signal line SG4 functions as a global source side select gate line and is connected to the select gate line SGS as a local select gate line in each block BLK through the row decoder 25.

The row decoder 25 includes a plurality of switch circuit groups 25A corresponding to respective blocks, and a plurality of block decoders 25B corresponding to the plurality of switch circuit groups 25A, respectively. Each switch circuit group 25A includes a plurality of transistors TR_SG0 to TR_SG4 connecting the signal lines SG0 to SG4 and the select gate lines SGD0 to SGD4, respectively, and a plurality of transistors TR_CG0 to TR_CG7 connecting the signal lines CG0 to CG7 and the word lines WL0 to WL7, respectively. The transistors TR_SG0 to TR_SG4 and the transistors TR_CG0 to TR_CG7 are high breakdown voltage transistors.

When designated by a row address, each block decoder 25B supplies a high-level block selection signal BLKSEL to gates of the transistors TR_SG0 to TR_SG4 and the transistors TR_CG0 to TR_CG7. Accordingly, in a switch circuit group 25A to which the high-level block selection signal BLKSEL is supplied from the block decoder 25B designated by the row address, the transistors TR_SG0 to TR_SG4 and the transistors TR_CG0 to TR_CG7 are turned on and conduct electricity. As a result, voltage supplied from the voltage supply circuit 28 to the signal lines SG0 to SG4 and the signal lines CG0 to CG7 is supplied to the select gate lines SGD0 to SGD3 and SGS and the word lines WL0 to WL7 included in a block BLK as an operation target.

When not designated by a row address, each block decoder 25B supplies a low-level block selection signal BLKSEL to the gates of the transistors TR_SG0 to TR_SG4 and the transistors TR_CG0 to TR_CG7. Accordingly, in a switch circuit group 25A to which the low-level block selection signal BLKSEL is supplied from a block decoder 25B designated by the row address, the transistors TR_SG0 to TR_SG4 and the transistors TR_CG0 to TR_CG7 are turned off and conduct no electricity. As a result, voltage supplied from the voltage supply circuit 28 to the signal lines SG0 to SG4 and the signal lines CG0 to CG7 is not supplied to the select gate lines SGD0 to SGD3 and SGS and the word lines WL0 to WL7 included in a block BLK as a non-operation target.

In other words, the voltage supply circuit 28 and the row decoder 25 supply the voltage VREAD, the voltage Vr, and the like to a select word line WL_sel of a selected block and supply the voltage \TREAD, VREADK, or the like to a non-select word lines WL_usel. For example, the voltage VSG is supplied to a select gate line SGD_sel connected to a select gate transistor ST1 belonging to a string unit SU as an operation target, and the voltage Vss such as 0 V is supplied to a select gate line SGD_usel connected to a select gate transistor ST1 not belonging to the string unit SU as an operation target. The voltage Vss such as 0 V is supplied to the word lines WL and the select gate lines SGD and SGS of a non-selected block.

Figure 12:
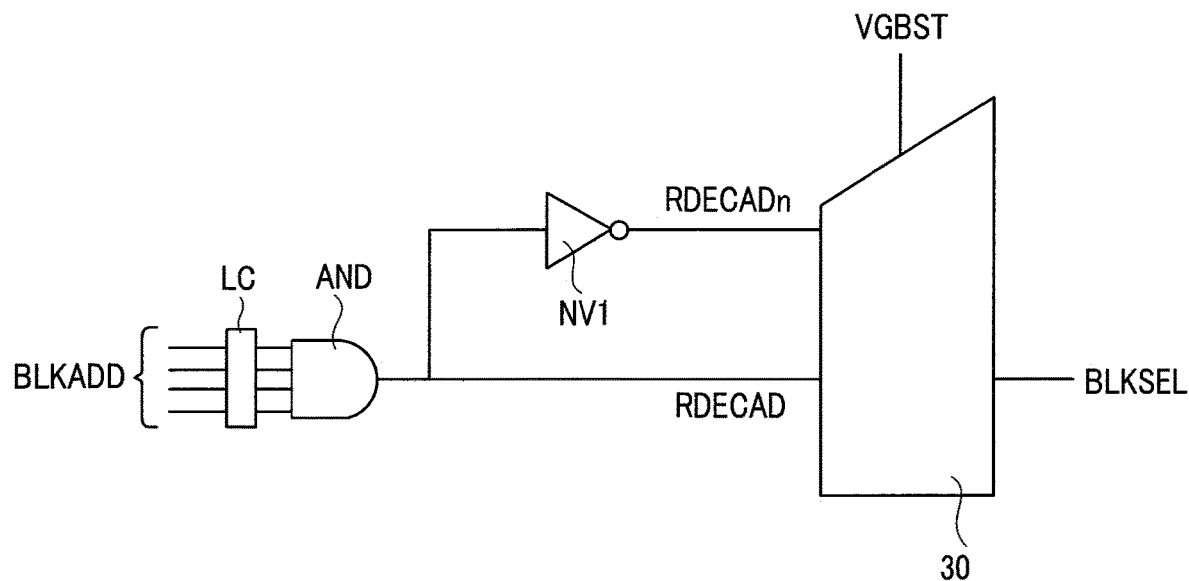
FIG. 12 is a block diagram illustrating an example of a configuration of a block decoder in a comparative example.

FIG. 12 is a block diagram illustrating an example of a configuration of a block decoder in a comparative example. The block decoders 25B includes, for example, a logical circuit LC, a logical multiplication circuit AND, an inverter NV1, and a level conversion circuit 30.

The logical circuit LC outputs an output signal based on a block address signal BLKADD input from the register 26. All output signals from the logical circuit LC are at "H" level (high level) in a block decoder 25B that the block address signal BLKADD hits, and either output signal from the logical circuit LC is at "L" level (low level) in a block decoder 25B that the block address signal BLKADD does not hit. The logical multiplication circuit AND outputs, as a signal RDECAD to the inverter NV1 and the level conversion circuit 30, a logical multiplication result of the output signals from the logical circuit LC. Specifically, the signal RDECAD at "H" level is output from a block decoder 25B that the block address signal BLKADD hits and for which a corresponding block BLK is determined to be normal. The signal RDECAD at "L" level is output from a block decoder 25B that the block address signal BLKADD does not hit or for which a corresponding block BLK is determined to be anomalous. Note that voltage of the signal RDECAD at "H" level is the power voltage VRD output from the BDH power voltage generation circuit 281A, and voltage of the signal RDECAD at "L" level is the ground voltage Vss (0 V). For example, VRD is 2.5 V. The inverter NV1 inverts the signal RDECAD output from the logical multiplication circuit AND. The inverter NV1 outputs a signal RDECADn as a result of the inversion.

The level conversion circuit 30 converts the signal RDECAD in accordance with the power voltage VRD into a signal BLKSEL in accordance with high power voltage (VGBST). Specifically, when the signal RDECAD at "H" level and the signal RDECADn at "L" level in accordance with the power voltage VRD are input, the level conversion circuit 30 converts the signals into the signal BLKSEL at "H" level in accordance with the power voltage VGBST and outputs the signal BLKSEL. When the signal RDECAD at "L" level and the signal RDECADn at "H" level are input, the level conversion circuit 30 outputs the signal RDECAD at "L" level as the signal BLKSEL at "L" level. Note that the power voltage VGBST is set to be voltage that turns on all transistors TR_SG0 to TR_SG4 and transistors TR_CG0 to TR_CG7 in the switch circuit group 25A corresponding to a selected block. In the read operation, the power voltage VGBST is set to be voltage (for example, 15 V) higher than the voltage VREAD.

Figure 13:
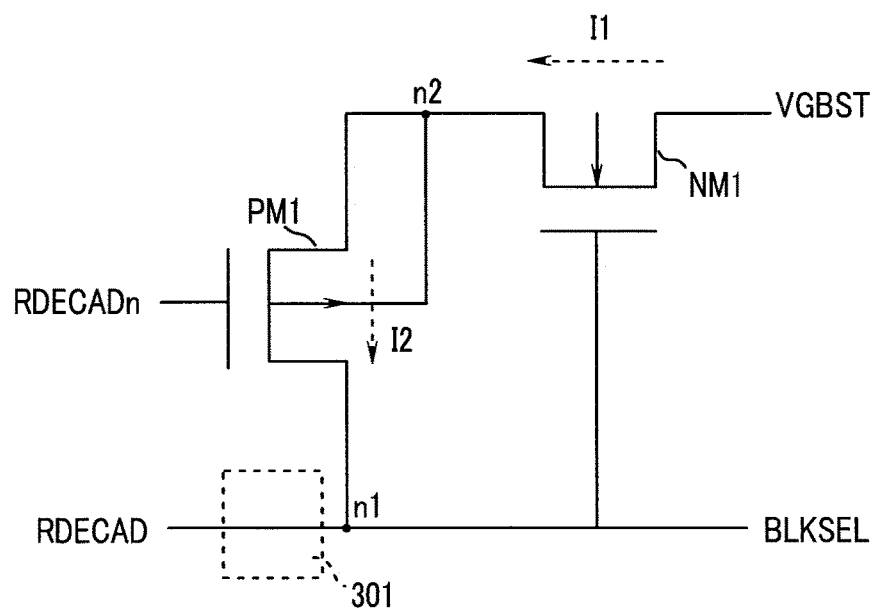
FIG. 13 is a block diagram illustrating an example of a configuration of a level conversion circuit.

FIG. 13 is a block diagram illustrating an example of a configuration of the level conversion circuit. The level conversion circuit 30 includes a depletion-type NMOS transistor NM1 and a high breakdown voltage PMOS transistor PM1. The power voltage VGBST is input to one end of the NMOS transistor NM1. The other end of the NMOS transistor NM1 is connected to one end of the PMOS transistor PM1. The signal RDECAD is input to the other end of the PMOS transistor PM1. The signal RDECAD is also input to a gate of the NMOS transistor NM1. The signal RDECADn is input to a gate of the PMOS transistor PM1. The signal BLKSEL is output from the other end of the PMOS transistor PM1. A backflow prevention circuit 301 is provided between an input terminal for the signal RDECAD and a connection point n1 among the other end of the PMOS transistor PM1, the input terminal for the signal RDECAD, and an output terminal for the signal BLKSEL.

The NMOS transistor NM1 and the PMOS transistor PM1 are both turned on when the signal RDECAD is at "H" level, that is, the voltage VRD, and the signal RDECADn is at "L" level, that is, the voltage Vss. Accordingly, the power voltage VGBST input to the one end of the NMOS transistor NM1 is output as the signal BLKSEL. Note that the power voltage VGBST is higher than the voltage Vss, but outflow toward the input terminal for the signal RDECAD is prevented since the backflow prevention circuit 301 is provided. Therefore, an output level of the signal BLKSEL remains at the power voltage VGBST.

Because the NMOS transistor NM1 is of the depletion type, it is not completely turned off when the signal RDECAD is at "L" level, that is, the voltage Vss, and the signal RDECADn is at "H" level, that is, the voltage VRD. Accordingly, current I1 flows through the NMOS transistor NM1, and voltage at a connection point n2 between the NMOS transistor NM1 and the PMOS transistor PM1 is stepped up to, for example, 1.8 V approximately. The voltage VRD is applied to the gate of the PMOS transistor PM1. The voltage VRD is, for example, 2.5 V and thus, the voltage applied to the gate is higher than the voltage at the connection point n2. Therefore, the PMOS transistor PM1 is turned off. Accordingly, the voltage Vss is output as the signal BLKSEL.

Figure 14:
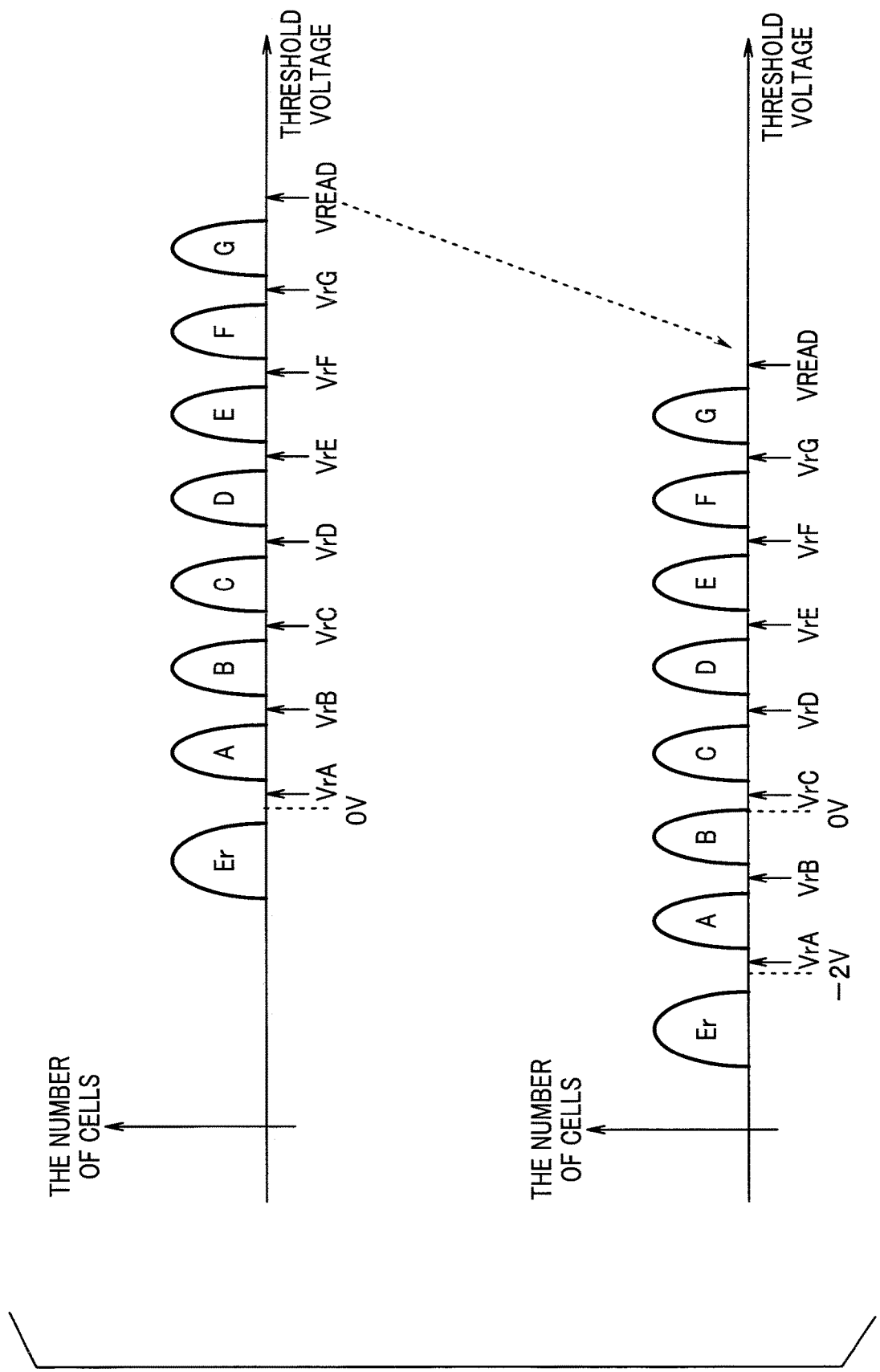
FIG. 14 is a diagram illustrating an example of threshold voltage distributions of the embodiment.

It has been increasingly requested to decrease operation voltage of the semiconductor storage device, and it has been desired to decrease applied voltage at reading. At the same time, to maintain reading accuracy, it has been requested not to reduce a width of each threshold voltage distribution region. Thus, there has been proposed a semiconductor storage device having threshold voltage distributions shifted to a negative voltage side with the width of each threshold voltage distribution region being maintained. FIG. 14 is a diagram illustrating an example of threshold voltage distributions of the embodiment. An upper part of FIG. 14 illustrates threshold voltage distributions in the comparative example, and a lower part illustrates the threshold voltage distributions in the embodiment. In the comparative example, the lowest voltage VrA among threshold voltages Vr that determine boundaries of regions is higher than 0 V. On the other hand, in the threshold voltage distributions of the embodiment, the threshold voltages Vr decrease in accordance with a decrease amount of the voltage \TREAD. Accordingly, the lowest voltage VrA is lower than 0 V (for example, −2 V approximately). The read operation of the non-volatile memory having such threshold voltage distributions will be described below with reference to FIG. 15.

Figure 15:
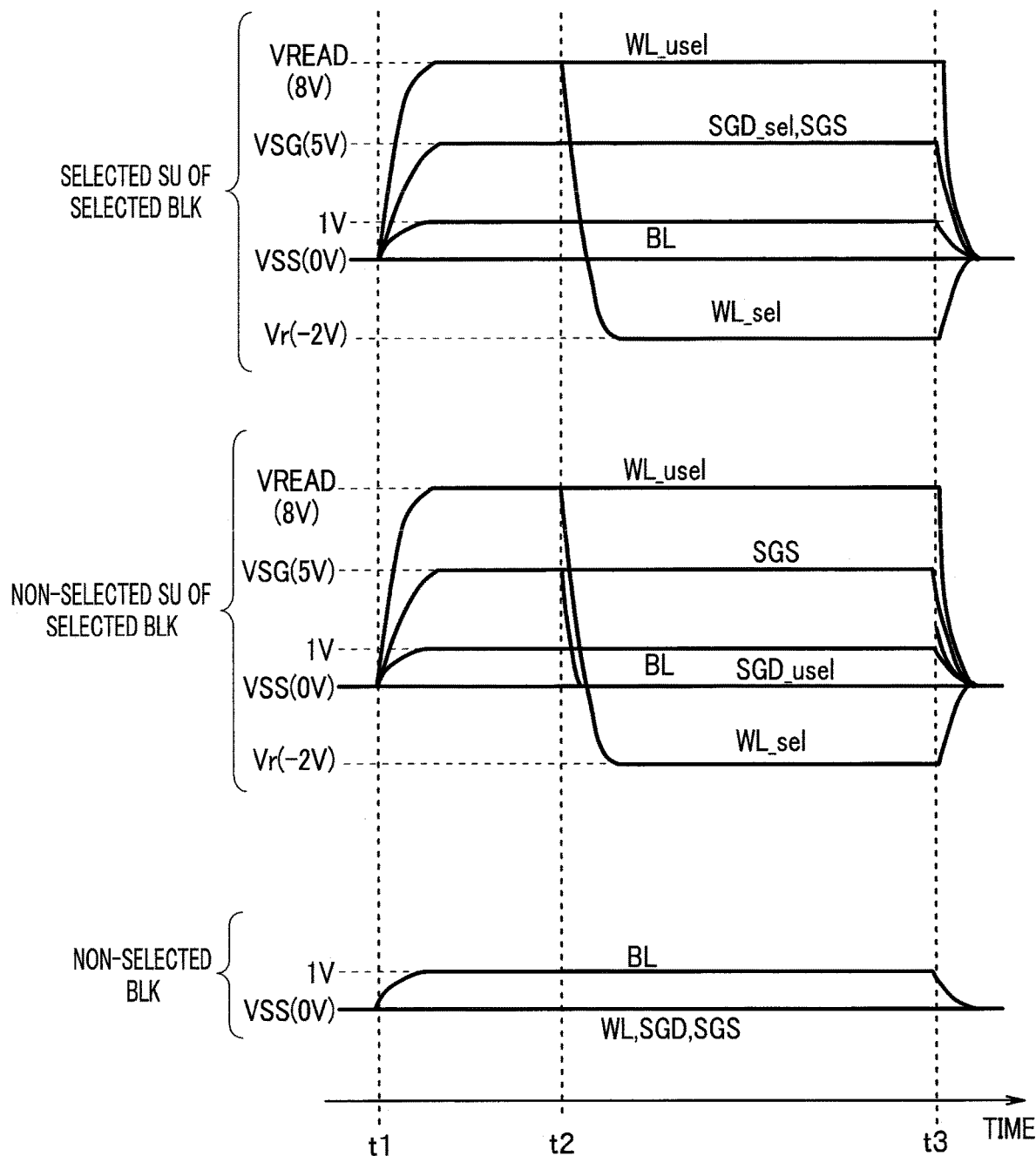
FIG. 15 is a diagram illustrating voltage change at each wire in read operation (verify operation) of the embodiment.

FIG. 15 is a diagram illustrating voltage change at each wire in the read operation (verify operation) of the embodiment. Voltage change at each wire in the USTRDIS duration (time point t1 to time point t2) is same as the voltage change in the comparative example illustrated in FIG. 7B. In addition, for wires other than a select word line WL_sel of a selected block, voltage distribution of each wire in the actual reading duration (time point t2 to time point t3) is same as the voltage change in the comparative example illustrated in FIG. 7B. In the actual reading duration (time point t2 to time point t3), the read voltage Vr applied to the select word line WL_sel of the selected block is negative voltage (for example, −2 V), which is different from the voltage change in the comparative example illustrated in FIG. 7B.

For example, when the select word line WL_sel is the word line WL0, the voltage VrA applied from the voltage supply circuit 28 to the signal line CG0 is negative voltage in the actual read operation. The low-level block selection signal BLKSEL (voltage VBB) supplied from TR_CG0 to TR_CG7, that is, a block decoder 25B needs to reliably turn off the transistor TR_CG0, to one end of which negative voltage (voltage VrA) is input. Therefore, the voltage VBB needs to be set to negative voltage lower than the voltage VrA. In the actual reading duration, the BDL power voltage generation circuit 281B of the present embodiment generates, as the power voltage VBB, negative voltage (for example, −4 V) lower than the voltage VrA. The power voltage VBB generated by the BDL power voltage generation circuit 281B is supplied to the voltage adjustment circuit 282 and can be also used to generate negative threshold voltage such as the voltage VrA.

Figure 16:
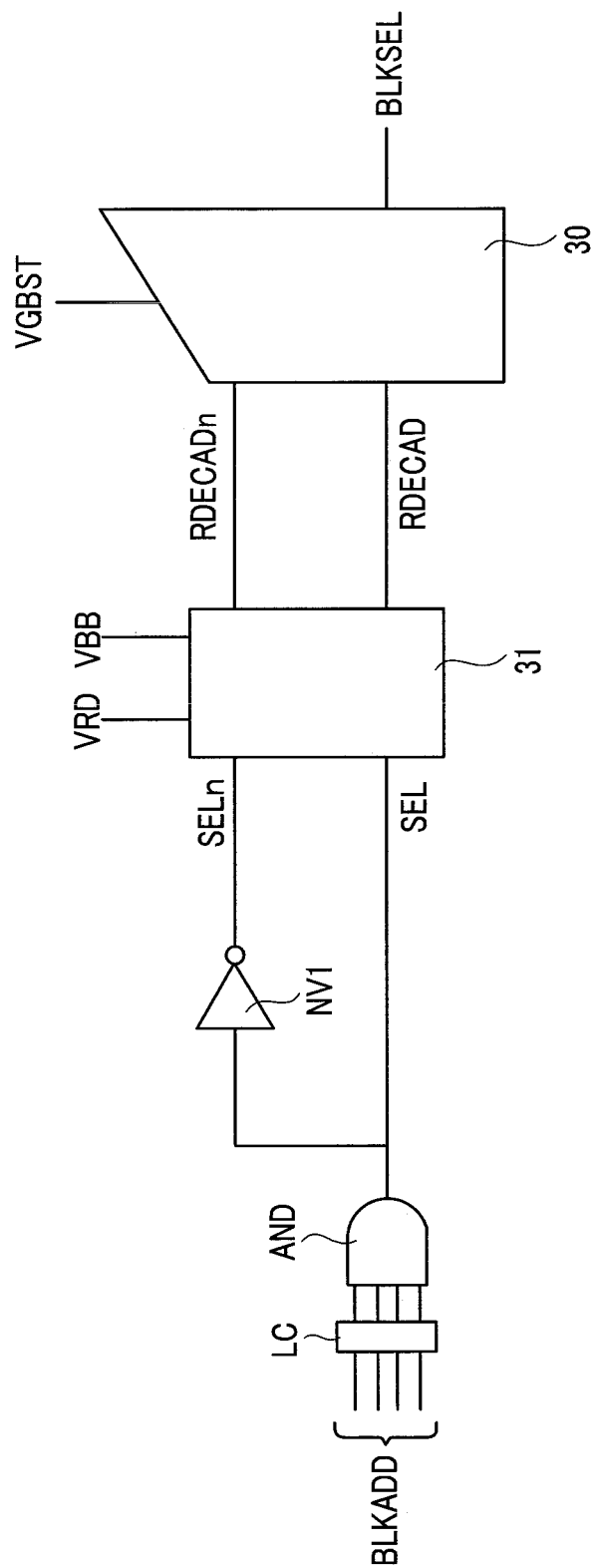
FIG. 16 is a block diagram illustrating an example of a configuration of a block decoder in the embodiment.

FIG. 16 is a block diagram illustrating an example of a configuration of a block decoder in the embodiment. The block decoder 25B includes, for example, the logical circuit LC, the logical multiplication circuit AND, the inverter NV1, the level conversion circuit 30, and a negative voltage conversion circuit 31.

The logical circuit LC outputs an output signal based on a block address signal BLKADD input from the register 26. All output signals from the logical circuit LC are at "H" level (high level) in a block decoder 25B that the block address signal BLKADD hits, and either output signal from the logical circuit LC is at "L" level (low level) in a block decoder 25B that the block address signal BLKADD does not hit. The logical multiplication circuit AND outputs, as a signal SEL to the inverter NV1 and the level conversion circuit 30, a logical multiplication result of the output signals from the logical circuit LC. Specifically, the signal SEL at "H" level is output from a block decoder 25B that the block address signal BLKADD hits and for which a corresponding block BLK is determined to be normal. The signal SEL at "L" level is output from a block decoder 25B that the block address signal BLKADD does not hit or for which a corresponding block BLK is determined to be anomalous. Note that voltage of the signal RDECAD at "H" level is the power voltage VRD output from the BDH power voltage generation circuit 281A, and voltage of the signal RDECAD at "L" level is the ground voltage Vss (=0 V). The inverter NV1 inverts the signal SEL output from the logical multiplication circuit AND. The inverter NV1 outputs a signal SELn as a result of the inversion.

Figure 17:
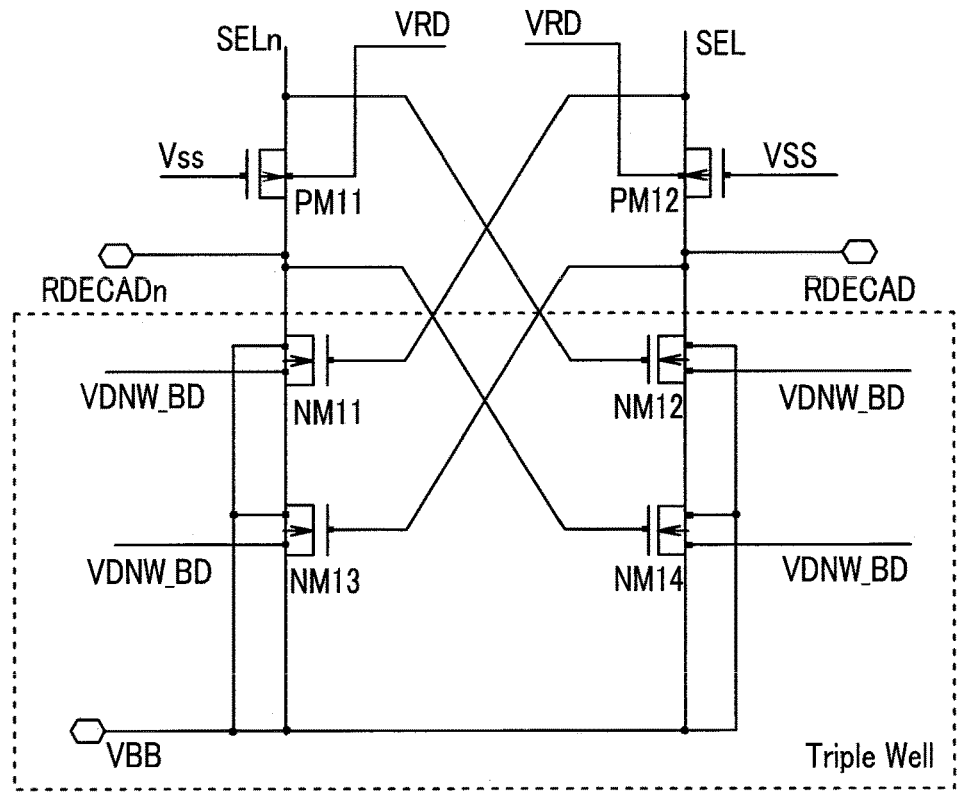
FIG. 17 is a circuit diagram illustrating an example of a configuration of a negative voltage conversion circuit 31 in the embodiment.

The negative voltage conversion circuit 31 converts the input signal SEL or the ground voltage Vss input as the signal SELn into the power voltage VBB that is negative voltage. FIG. 17 is a circuit diagram illustrating an example of a configuration of the negative voltage conversion circuit 31 in the embodiment. The negative voltage conversion circuit 31 includes two PMOS transistors PM11 and PM12 and four NMOS transistors NM11, NM12, NM13, and NM14. The PMOS transistor PM11 and the NMOS transistors NM11 and NM13 are connected in series between an input terminal for the signal SELn and an input terminal for the power voltage VBB. The PMOS transistor PM12 and the NMOS transistors NM12 and NM14 are connected in series between an input terminal for the signal SEL and the input terminal for the power voltage VBB.

The ground voltage Vss is input to gates of the PMOS transistors PM11 and PM12. The signal SEL is input to a gate of the NMOS transistor NM11. The signal SELn is input to a gate of the NMOS transistor NM12. Voltage at a connection point between the PMOS transistor PM12 and the NMOS transistor NM12 is input to a gate of the NMOS transistor NM13. Voltage at a connection point between the PMOS transistor PM11 and the NMOS transistor NM11 is input to a gate of the NMOS transistor NM14. The power voltage VRD as well voltage is supplied to the PMOS transistors PM11 and PM12. The NMOS transistors NM11 to NM14 have a triple-well structure.

Figure 18:
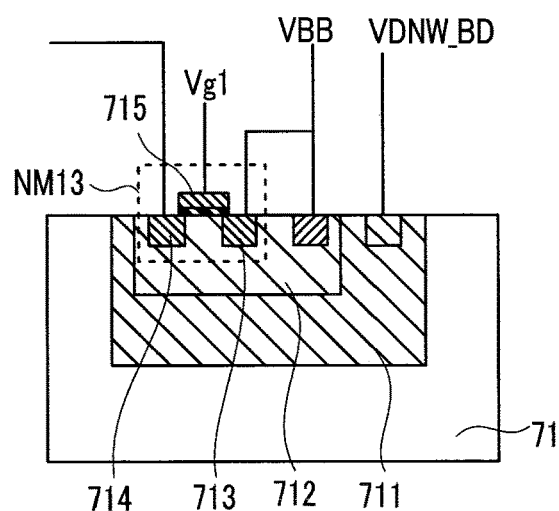
FIG. 18 is a cross-sectional view for description of a structure of an NMOS transistor in the negative voltage conversion circuit.

FIG. 18 is a cross-sectional view for description of an NMOS transistor structure in the negative voltage conversion circuit. FIG. 18 illustrates a structure of the NMOS transistor NM13, but the other NMOS transistors NM11, NM12, and NM14 have the same structure. In the NMOS transistor NM13, an N well 711 formed through injection and diffusion of n-type impurities (for example, arsenic (As)) is provided in a predetermined region of the p-type semiconductor substrate 71. A P well 712 formed through injection and diffusion of p-type impurities (for example, boron (B)) is provided in the N well 711. A source region 713 and a drain region 714 formed through injection and diffusion of n-type impurities (for example, phosphorus (P)) are provided in the P well 712. A gate electrode 715 made of a conductive material is provided on the semiconductor substrate between the source region 713 and the drain region 714 through a gate insulating film. In other words, the NMOS transistor NM13 is formed of the source region 713, the drain region 714, and the gate electrode 715. The negative power voltage VBB is supplied to the source region 713 and the P well 712. Voltage VDNW BD (>0 V) is supplied to the N well 711. In a case of an NMOS transistor having a structure in which the N well 711 is not provided, when negative voltage is applied to the n-type source region 713, forward bias is formed between the n-type source region 713 and the p-type semiconductor substrate 71, which is fixed at the ground voltage Vss (0 V), and large leakage current flows from the NMOS transistor NM13 to the semiconductor substrate 71. In the present embodiment, since the NMOS transistor NM13 has such a triple-well structure, a leakage path can be cut off by the N well 711, which is formed between the P well 712 and the semiconductor substrate 71, when negative voltage is applied to the source region 713.

The voltage at the connection point between the PMOS transistor PM12 and the NMOS transistor NM12 is output as the signal RDECAD. The voltage at the connection point between the PMOS transistor PM11 and the NMOS transistor NM11 is output as the signal RDECADn.

When the signal SEL is at "H" level, the power voltage VRD is input to one end of the PMOS transistor PM12. Since the signal SELn is at "L" level, the ground voltage Vss is input to one end of the PMOS transistor PM11. In this case, the PMOS transistor PM12 is turned on and the PMOS transistor PM11 is turned off. The NMOS transistors NM11 and NM13 are turned on since the voltage VRD is applied to the gates of NMOS transistors NM11 and NM13. The NMOS transistor NM12 is turned off since the voltage Vss is applied to the gate of the NMOS transistor NM12. The NMOS transistor NM14 is turned off since the voltage VBB is applied to the gate of the NMOS transistor NM14. In this manner, the transistors PM11, NM12, and NM14 are switched off, and the transistors PM12, NM11, and NM13 are switched on, and accordingly, the voltage VRD is output as the signal RDECAD, and the voltage VBB is output as the signal RDECADn.

When the signal SEL is at "L" level, the power voltage Vss is input to the one end of the PMOS transistor PM12. Since the signal SELn is at "H" level, the power voltage VRD is input to the one end of the PMOS transistor PM11. In this case, the PMOS transistor PM11 is turned on and the PMOS transistor PM12 is turned off. The NMOS transistors NM12 and NM14 are turned on since the voltage VRD is applied to the gates of the NMOS transistors NM12 and NM14. The NMOS transistor NM11 is turned off since the voltage Vss is applied to the gate of the NMOS transistor NM11. The NMOS transistor NM13 is turned off since the voltage VBB is applied to the gate of the NMOS transistor NM13. In this manner, the transistors PM11, NM12, and NM14 are switched on, and the transistors PM12, NM11, and NM13 are switched on, and accordingly, the voltage VBB is output as the signal RDECAD, and the voltage VRD is output as the signal RDECADn. The signals RDECAD and RDECADn output from the negative voltage conversion circuit 31 are input to the level conversion circuit 30.

In the level conversion circuit 30, the NMOS transistor NM1 and the PMOS transistor PM1 are both turned on when the signal RDECAD is at "H" level, that is, the voltage VRD, and the signal RDECADn is at "L" level, that is, the voltage VBB. Thus, the power voltage VGBST input to the one end of the NMOS transistor NM1 is output as the signal BLKSEL.

Because the NMOS transistor NM1 is of the depletion type, it is not completely turned off when the signal RDECAD is at "L" level, that is, the voltage VBB, and the signal RDECADn is at "H" level, that is, the voltage VRD. Accordingly, the current I1 flows through the NMOS transistor NM1, and the voltage at the connection point n2 between the NMOS transistor NM1 and the PMOS transistor PM1 is stepped up to, for example, 2 V approximately. The voltage VRD is applied to the gate of the PMOS transistor PM1. The voltage VRD is, for example, 2.5 V, and thus the voltage applied to the gate is higher than the voltage at the connection point n2. Therefore, the PMOS transistor PM1 is turned off. Thus, the voltage VBB is output as the signal BLKSEL.

In the comparative example, "H" voltage level of the signals RDECAD and RDECADn generated at the block decoder 25B is the power voltage VRD and is a fixed value (for example, 2.5 V) during the read operation. An "L" voltage level of the signals RDECAD and RDECADn is the ground voltage Vss and is a fixed value (for example, 0 V) during the read operation. On the other hand, in the embodiment, the "H" voltage level of the signals RDECAD and RDECADn generated at the block decoder 25B is the power voltage VRD, and a value of the power voltage VRD changes during the read operation. The "L" voltage level of the signals RDECAD and RDECADn is the power voltage VBB, and a value of the power voltage VBB changes during the read operation.

Figure 19:
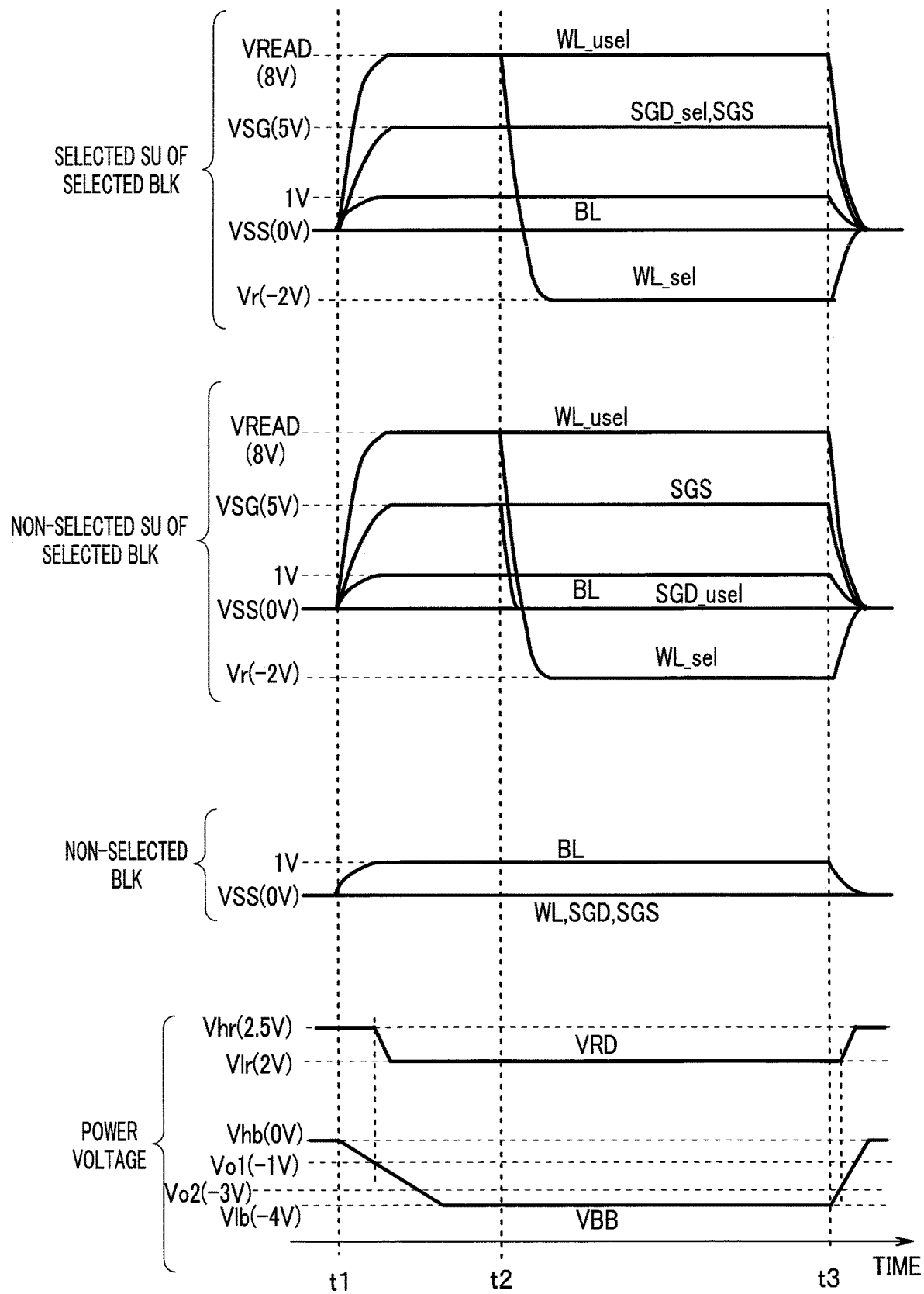
FIG. 19 is a diagram illustrating voltage change of power voltage in read operation (verify operation) of the embodiment.

FIG. 19 is a diagram illustrating voltage change of the power voltage in the read operation (verify operation) of the embodiment. As illustrated in FIG. 19, the power voltage VBB is at the ground voltage of 0 V (the ground voltage Vss, voltage Vhb) before read-operation start time t1. The power voltage VBB starts decreasing at read-operation start time t1 and decreases to voltage Vlb, that is, voltage value (for example, −4 V) lower than the voltage VrA, which can reliably turn off a transistor TR_CG, to one end of which negative voltage (the voltage VrA) is input, in the USTRDIS duration. The power voltage VBB is maintained at the voltage Vlb in the actual reading duration. The power voltage VBB starts increasing at actual-reading-duration end time t3 and continues increasing until the voltage Vhb is reached. Note that the power voltage VBB may start decreasing from the ground voltage of 0 V at slight delay from read-operation start time t1.

Before read-operation start time t1, the power voltage VRD is at voltage (voltage Vhr; for example, 2.5 V) same as in the comparative example. In the USTRDIS duration, the power voltage VBB starts decreasing after reaching predetermined threshold voltage Vo1 (for example, −1 V). The power voltage VRD decreases to voltage Vlr (for example, 2 V) in the USTRDIS duration. The power voltage VRD is maintained at the voltage Vlr in the actual reading duration. After actual-reading-duration end time t3, the power voltage VRD starts increasing once the power voltage VBB reaches predetermined threshold voltage Vo2 (for example, −3 V), and continues increasing until the voltage Vhr is reached.

Reasons for the change of the power voltage VRD and VBB are as follows. First, the reason for the change of the power voltage VBB will be described below. The power voltage VBB as negative voltage is generated through electrical discharging of the ground voltage Vss. Since a consumption amount of current increases in an electrical discharging duration, it is required to shorten a generation time of negative voltage as much as possible. Thus, the power voltage VBB is desirably maintained at the voltage Vlb from time point t2 to time point t3 in the actual reading duration and changed to the ground voltage Vss (voltage Vhb) in the other duration. Accordingly, the power voltage VBB starts decreasing from the voltage Vhb at read-operation start time t1, remains at the voltage Vlb between time points t2 and t3, and starts increasing again at time point t3 until the voltage Vhb is reached.

Figure 21:
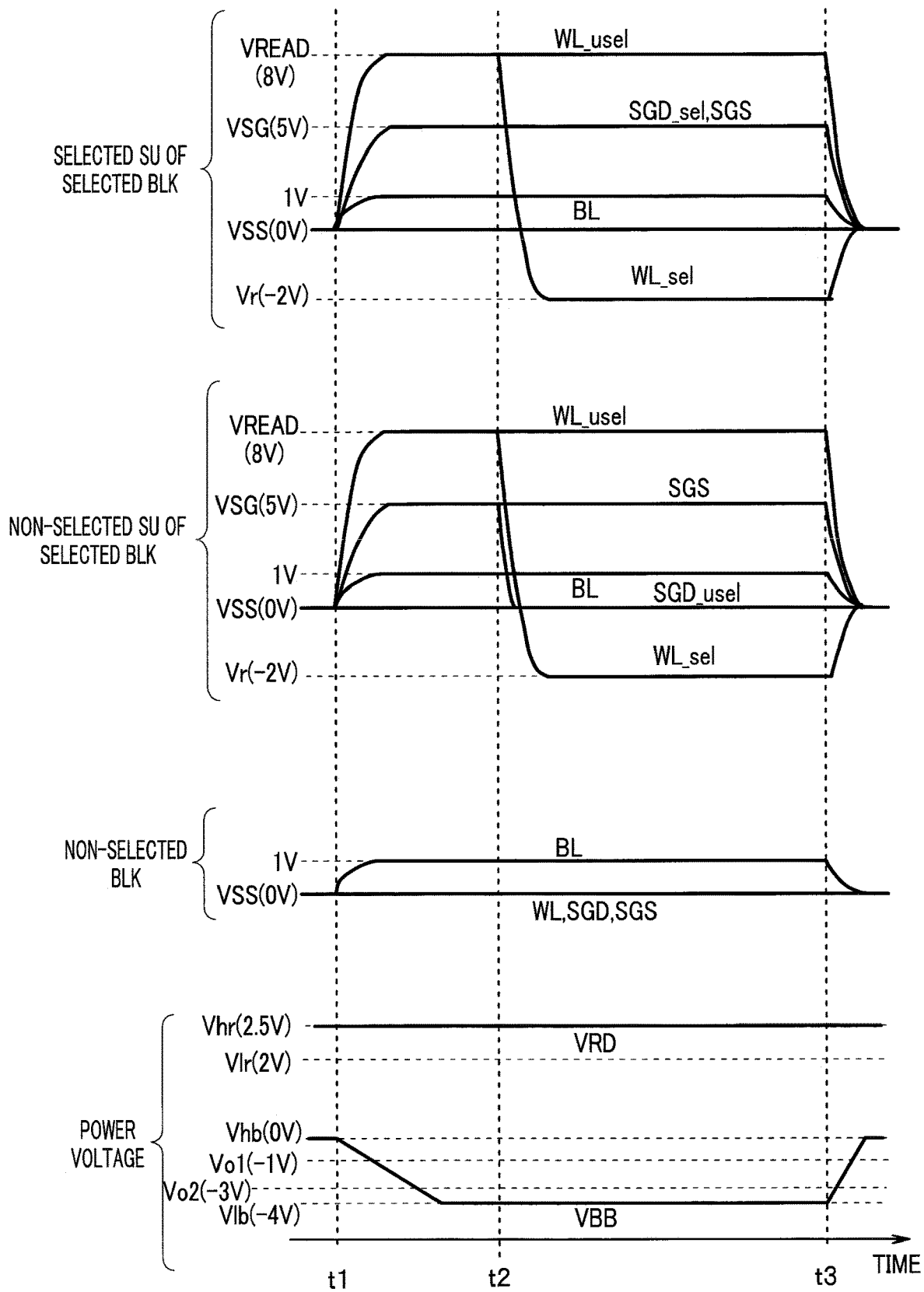
FIG. 21 is a diagram illustrating voltage change of power voltage in read operation (verify operation) of the comparative example.

Subsequently, the reason for the change of the power voltage VRD will be described below. As illustrated in FIG. 21, when the power voltage VRD is fixed at the voltage Vhr (for example, 2.5 V) through the entire duration of the read operation, difference between the power voltage VRD and the power voltage VBB is 6.5 V in the actual reading duration. When the NMOS transistors NM11 and NM13 between the PMOS transistor PM11 and the input terminal for the power voltage VBB are turned on, source voltage and well voltage of the PMOS transistor PM11 become equal to the power voltage VBB and the power voltage VRD, respectively. The PMOS transistor PM11 of the negative voltage conversion circuit 31 is a low breakdown voltage transistor, and thus difference between the voltage Vhr and the voltage Vlb potentially exceeds junction breakdown voltage (for example, 6 V). Similarly, the PMOS transistor PM12 is a low breakdown voltage transistor, and thus difference between source voltage and well voltage of the PMOS transistor PM12 potentially exceeds junction breakdown voltage when the NMOS transistors NM12 and NM14 are turned on. To avoid this problem, the power voltage VRD is preferably decreased to the voltage Vlr (for example, 2 V) in the actual reading duration so that difference between source voltage and well voltage does not exceed junction breakdown voltage.

Figure 22:
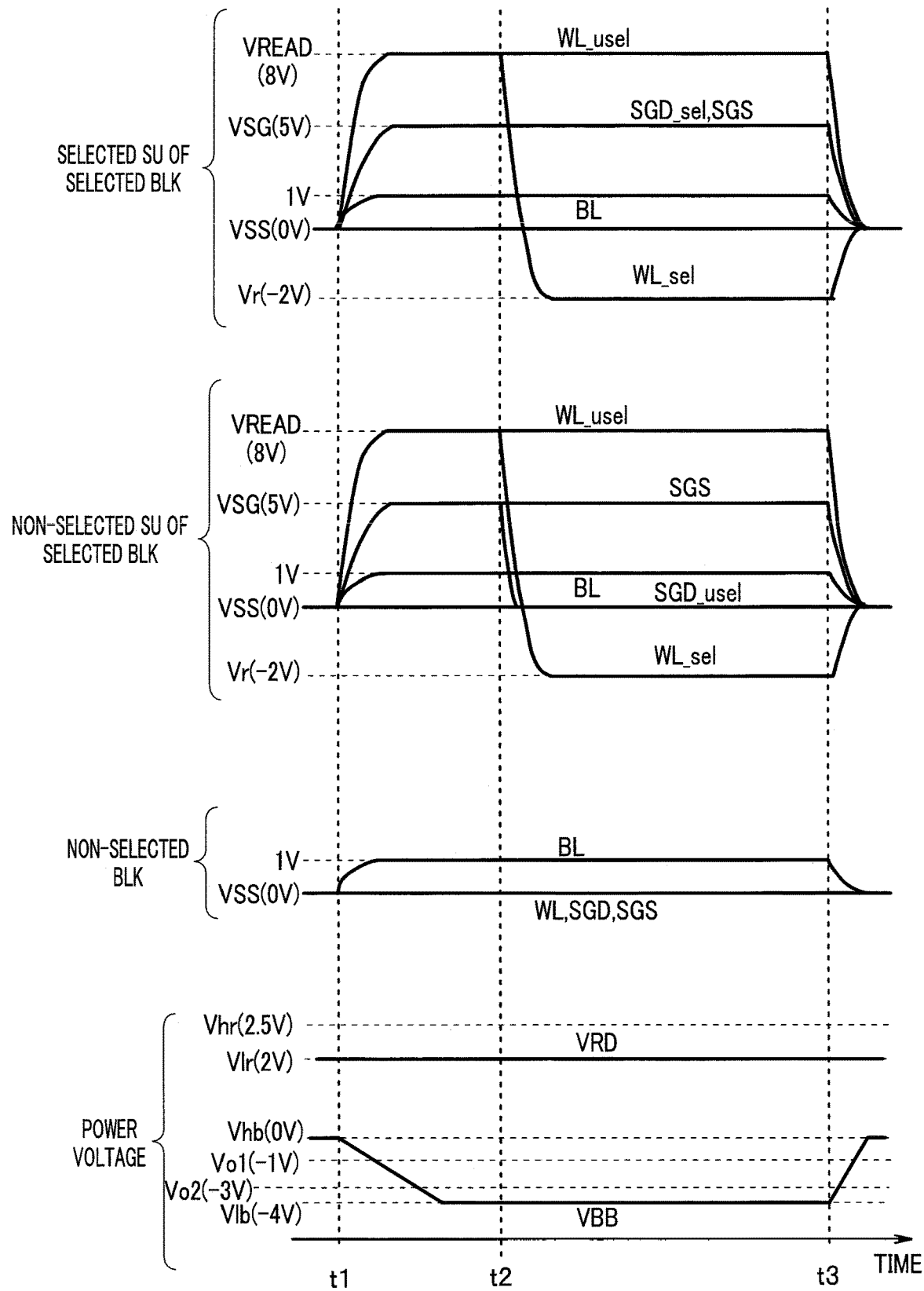
FIG. 22 is a diagram illustrating voltage change of power voltage in read operation (verify operation) of the comparative example.

As illustrated in FIG. 22, when the value of the power voltage VRD is fixed at the voltage Vlr (for example, 2 V) through the entire duration of the read operation, a voltage value applied to the gate of the PMOS transistor PM1 in the level conversion circuit 30 is the voltage Vlr. Near time point t1, the signal RDECAD is at "L" level, that is, voltage Vlh (0 V), and because the NMOS transistor NM1 is of the depletion type, it is not completely turned off when the signal RDECADn is at "H" level, that is, the voltage Vlr (for example, 2 V). Accordingly, the current I1 flows through the NMOS transistor NM1, and the voltage at the connection point n2 between the NMOS transistor NM1 and the PMOS transistor PM1 is stepped up to, for example, 1.8 V approximately. Since the voltage Vlr (for example, 2 V) is applied to the gate of the PMOS transistor PM1, the voltage applied to the gate is equivalent to the voltage at the connection point n2. In this case, the PMOS transistor PM1 is not completely turned off, and leakage current I2 potentially increases. Thus, the voltage applied to the gate of the PMOS transistor PM1 is preferably increased to prevent leakage current when the value of the power voltage VBB is high and the NMOS transistor NM1 is not completely turned off. For the above-described two reasons, the power voltage VRD is changed in accordance with the value of the power voltage VBB in the embodiment.

The value of the power voltage VBB and the value of the power voltage VRD are controlled by the sequencer 27. The sequencer 27 controls the value of the power voltage VBB in accordance with a sequence implemented in advance. The sequencer 27 monitors the value of the power voltage VBB and controls the value of the power voltage VRD based on the two threshold voltages Vo1 and Vo2 set in advance as triggers.

Figure 20:
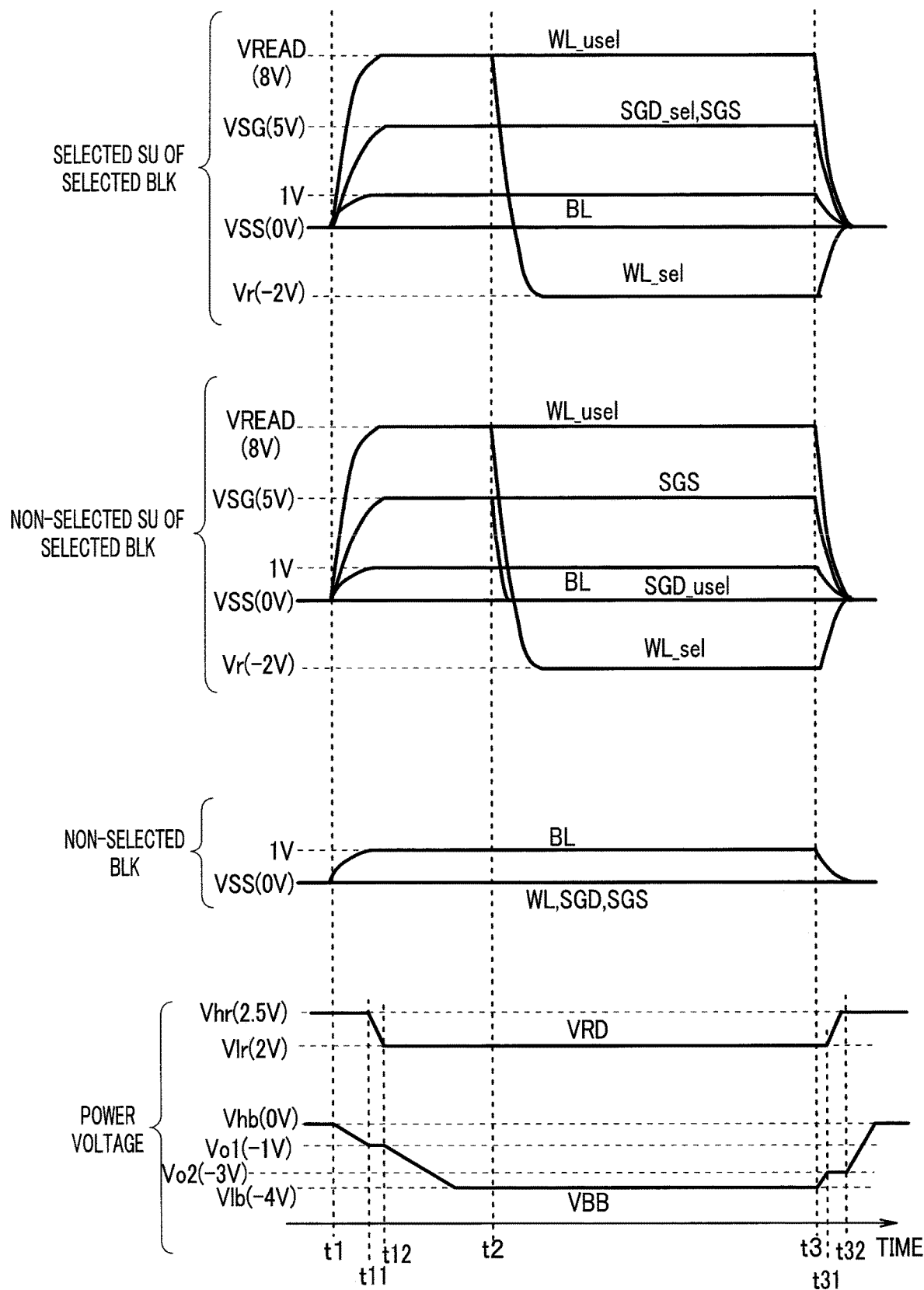
FIG. 20 is a diagram illustrating other voltage change of power voltage in read operation (verify operation) of the embodiment.

Note that the sequencer 27 may control the value of the power voltage VRD, as well, in accordance with a sequence implemented in advance. FIG. 20 is a diagram illustrating other voltage change of the power voltage in the read operation (verify operation) of the embodiment. In an example illustrated in FIG. 19, the power voltage VBB is discharged through one step from the voltage Vhb to the voltage Vlb and charged through one step from the voltage Vlb to the voltage Vhb, but in an example illustrated in FIG. 20, the power voltage VBB is discharged through two steps from the voltage Vhb to the voltage Vo1 and then from the voltage Vo1 to the voltage Vlb and charged through two steps from the voltage Vlb to the voltage Vo2 and then from the voltage Vo2 to the voltage Vhb. When a duration in which the power voltage VBB is maintained at the threshold voltage Vo1 is provided between the two steps in discharging and a duration in which the power voltage VBB is maintained at the threshold voltage Vo2 is provided between the two steps in charging, the sequencer 27 may implement a sequence in advance so that the power voltage VRD starts discharging in the duration (time point t11 to time point t12) in which the power voltage VBB is maintained at the threshold voltage Vo1 and the power voltage VRD starts charging in the duration (time point t31 to time point t32) in which the power voltage VBB is maintained at the threshold voltage Vo2, thereby controlling a voltage value of the power voltage VRD without monitoring voltage of the power voltage VBB.

In the example illustrated in FIG. 20, the power voltage VBB starts decreasing from the ground voltage of 0 V at read-operation start time t1, but may start decreasing from the ground voltage of 0 V at slight delay from read-operation start time t1.

In this manner, the semiconductor storage device of the embodiment controls the voltage values of the power voltage VRD and VBB supplied to each block decoder 25B in the read operation, and thus can improve reliability of the block decoder 25B and reliably turn off any switch circuit group 25A corresponding to a non-selected block.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first block including a first memory cell;
   a second block including a second memory cell;
   a first local word line connected to a gate of the first memory cell;
   a second local word line connected to a gate of the second memory cell;
   a bit line electrically connected to one end of the first memory cell;
   a global word line;
   a voltage generation circuit configured to generate and supply a read voltage to the global word line;
   a first transfer transistor connected between the global word line and the first local word line;
   a second transfer transistor connected between the global word line and the second local word line;
   a first block decoder configured to supply either one of a first selection signal or a first non-selection signal to a gate of the first transfer transistor in response to a block address input thereto;
   a second block decoder configured to supply either one of a second selection signal or a second non-selection signal to a gate of the second transfer transistor in response to the block address input thereto; and
   a control unit configured to perform a read operation to either one of the first memory cell or the second memory cell in response to a read command accompanied with the block address, wherein
   the voltage generation circuit is further configured to generate and supply a first power voltage and a second power voltage to each of the first block decoder and the second block decoder, and
   during the read operation, a value of the first power voltage is changed between a first set value and a second set value lower than the first set value, and a value of the second power voltage is changed between a third set value lower than the first set value and a fourth set value lower than both of the second set value and the third set value, the first set value being larger than zero volt, the fourth set value being lower than zero volt.

2. The semiconductor storage device according to claim 1, wherein the read voltage is lower than zero volt.

3. The semiconductor storage device according to claim 2, wherein the value of the first power voltage is changed from the first set value to the second set value after the value of the second power voltage starts decreasing from the third set value and before reaching the fourth set value, and the value of the first power voltage is changed from the second set value to the first set value after the value of the second power voltage starts increasing from the fourth set value and before reaching the third set value.

4. The semiconductor storage device according to claim 3, wherein
   the value of the first power voltage is changed from the first set value to the second set value when the value of the second power voltage reaches a first intermediate set value, and the value of the first power voltage is changed from the second set value to the first set value when the value of the second power voltage reaches a second intermediate set value, the first intermediate set value and the second intermediate set value being provided between the third set value and the fourth set value, and
   the value of the second power voltage is stepped down in two stages including a first discharging from the third set value to the first intermediate set value and a second discharging from the first intermediate set value to the fourth set value, and the value of the second power voltage is stepped up in two stages including a first charging from the fourth set value to the second intermediate set value and a second charging from the second intermediate set value to the third set value.

5. The semiconductor storage device according to claim 3, wherein the control unit changes the value of the first power voltage based on a monitor result of the value of the second power voltage.

6. The semiconductor storage device according to claim 4, wherein the control unit changes the value of the first power voltage between the first discharging and the second discharging and changes the value of the first power voltage between the first charging and the second charging.

7. The semiconductor storage device according to claim 4, wherein the value of the second power voltage is maintained at the first intermediate set value for a first duration after the value of the second power voltage reaches the first intermediate set value between the first discharging and the second discharging, and the value of the second power voltage is maintained at the second intermediate set value for a second duration after the value of the second power voltage reaches the second intermediate set value between the first charging and the second charging.

8. The semiconductor storage device according to claim 7, wherein the control unit changes the value of the first power voltage in the first duration and changes the value of the first power voltage in the second duration.

9. The semiconductor storage device according to claim 4, wherein the control unit maintains the value of the second power voltage at the first intermediate set value for a first duration after the first discharging ends, and the control unit maintains the value of the second power voltage at the second intermediate set value for a second duration after the first charging ends.

10. The semiconductor storage device according to claim 9, wherein the control unit changes the value of the first power voltage within the first duration and changes the value of the first power voltage within the second duration.

11. The semiconductor storage device according to claim 1, wherein the second set value is larger than zero volt, and the third set value is zero volt.

12. A voltage control method for a semiconductor storage device including a first block including a first memory cell; a second block including a second memory cell; a first local word line connected to a gate of the first memory cell; a second local word line connected to a gate of the second memory cell; a bit line electrically connected to one end of the first memory cell; a global word line; a voltage generation circuit configured to generate and supply a read voltage to the global word line; a first transfer transistor connected between the global word line and the first local word line; a second transfer transistor connected between the global word line and the second local word line; a first block decoder configured to supply either one of a first selection signal or a first non-selection signal to a gate of the first transfer transistor in response to a block address input thereto; a second block decoder configured to supply either one of a second selection signal or a second non-selection signal to a gate of the second transfer transistor in response to the block address input thereto; and a control unit configured to perform a read operation to either one of the first memory cell or the second memory cell in response to a read command accompanied with the block address, the voltage control method comprising:
generating and supplying a first power voltage and a second power voltage to each of the first block decoder and the second block decoder; and
during the read operation, changing a value of the first power voltage between a first set value and a second set value lower than the first set value, and changing a value of the second power voltage between a third set value lower than the first set value and a fourth set value lower than both of the second set value and the third set value, the first set value being larger than zero volt, the fourth set value being lower than zero volt.

13. The voltage control method for the semiconductor storage device according to claim 12, further comprising:
changing the value of the first power voltage from the first set value to the second set value after the value of the second power voltage starts decreasing from the third set value and before reaching the fourth set value; and
changing the value of the first power voltage from the second set value to the first set value after the value of the second power voltage starts increasing from the fourth set value and before reaching the third set value.

14. The voltage control method for the semiconductor storage device according to claim 13, further comprising:
changing the value of the first power voltage from the first set value to the second set value when the value of the second power voltage reaches a first intermediate set value, and changing the value of the first power voltage from the second set value to the first set value when the value of the second power voltage reaches a second intermediate set value, the first intermediate set value and the second intermediate set value being provided between the third set value and the fourth set value; and
stepping down the value of the second power voltage in two stages including a first discharging from the third set value to the first intermediate set value and a second discharging from the first intermediate set value to the fourth set value, and stepping up the value of the second power voltage in two stages including a first charging from the fourth set value to the second intermediate set value and a second charging from the second intermediate set value to the third set value.

15. The voltage control method for the semiconductor storage device according to claim 14, further comprising:
changing the value of the first power voltage between the first discharging and the second discharging; and
changing the value of the first power voltage between the first charging and the second charging.

16. The voltage control method for the semiconductor storage device according to claim 15, further comprising:
maintaining the value of the second power voltage at the first intermediate set value for a first duration after the value of the second power voltage reaches the first intermediate set value during step-down of the second power voltage between the first discharging and the second discharging; and
maintaining the value of the second power voltage at the second intermediate set value for a second duration after the value of the second power voltage reaches the second intermediate set value during step-up of the second power voltage between the first charging and the second charging.

17. The voltage control method for the semiconductor storage device according to claim 16, further comprising:
changing the value of the first power voltage in the first duration; and
changing the value of the first power voltage in the second duration.

18. The voltage control method for the semiconductor storage device according to claim 14, further comprising:
maintaining the value of the second power voltage at the first intermediate set value for a first duration after the first discharging ends; and
maintaining the value of the second power voltage at the second intermediate set value for a second duration after the first charging ends.

19. The voltage control method for the semiconductor storage device according to claim 18, further comprising:
changing the value of the first power voltage within the first duration; and
changing the value of the first power voltage within the second duration.

* * * * *